(12) United States Patent
Nakata et al.

(10) Patent No.: US 7,169,209 B2
(45) Date of Patent: Jan. 30, 2007

(54) FUNCTIONAL ALLOY PARTICLES

(75) Inventors: Shuichi Nakata, Fuji (JP); Yasuki Shimamura, Fuji (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 241 days.

(21) Appl. No.: 10/398,114

(22) PCT Filed: Oct. 2, 2001

(86) PCT No.: PCT/JP01/08687

§ 371 (c)(1),
(2), (4) Date: Apr. 2, 2003

(87) PCT Pub. No.: WO02/28574

PCT Pub. Date: Apr. 11, 2002

(65) Prior Publication Data

US 2004/0079194 A1  Apr. 29, 2004

(30) Foreign Application Priority Data

Oct. 2, 2000  (JP) .............................. 2000-301762

(51) Int. Cl.
*C22C 9/00* (2006.01)
(52) U.S. Cl. ....................... 75/255; 252/512; 252/514; 252/519.15; 252/520.1; 428/580
(58) Field of Classification Search ............... 75/255, 75/332, 338; 252/512, 514, 519.15, 520.1; 428/580
See application file for complete search history.

(56) References Cited

U.S. PATENT DOCUMENTS 5,817,194 A  10/1998  Nagai et al.
5,980,785 A * 11/1999  Xi et al. ..................... 252/512
6,059,952 A *  5/2000  Kang et al. ................. 205/143
6,342,442 B1  1/2002  Angst et al.
6,416,597 B1 *  7/2002  Shangguan et al. ......... 148/513
6,613,123 B2 *  9/2003  Corbin et al. ................ 75/255

FOREIGN PATENT DOCUMENTS

| JP | 2-134897 A | 5/1990 |
|---|---|---|
| JP | 3-46774 A | 2/1991 |
| JP | 5-337679 A | 12/1993 |
| JP | 6-47577 A | 2/1994 |
| JP | 7-155980 A | 6/1995 |
| JP | 7-171693 A | 7/1995 |
| JP | 9-174278 A | 7/1997 |
| JP | 9-206983 A | 8/1997 |
| JP | 9-295182 A | 11/1997 |
| JP | 10-6073 A | 1/1998 |
| JP | 10-265748 A | 10/1998 |
| JP | 10-279902 A | 10/1998 |
| JP | 11-129091 A | 5/1999 |
| JP | 11-214575 A | 8/1999 |

* cited by examiner

*Primary Examiner*—George Wyszomierski
(74) *Attorney, Agent, or Firm*—Birch, Stewart, Kolasch & Birch LLP

(57) ABSTRACT

Disclosed are metal alloy particles containing substantially no lead, each exhibiting a plurality of different melting points including an original lowest melting point (a) and a highest melting point, wherein, when the metal alloy particles are subjected to differential scanning calorimetry (DSC), at least one exothermic peak is observed in the DSC, wherein each of the metal alloy particles exhibits the original lowest melting point (a) at least at a surface portion thereof, and wherein, when each metal alloy particle is heated at a temperature equal to or higher than the original lowest melting point (a) to melt at least a surface portion of each metal alloy particle, followed by cooling to room temperature to thereby solidify the melted portion of each metal alloy particle, the resultant solid metal alloy particle having experienced the melting and solidification exhibits an elevated lowest melting point (a') higher than the original lowest melting point (a).

20 Claims, 6 Drawing Sheets

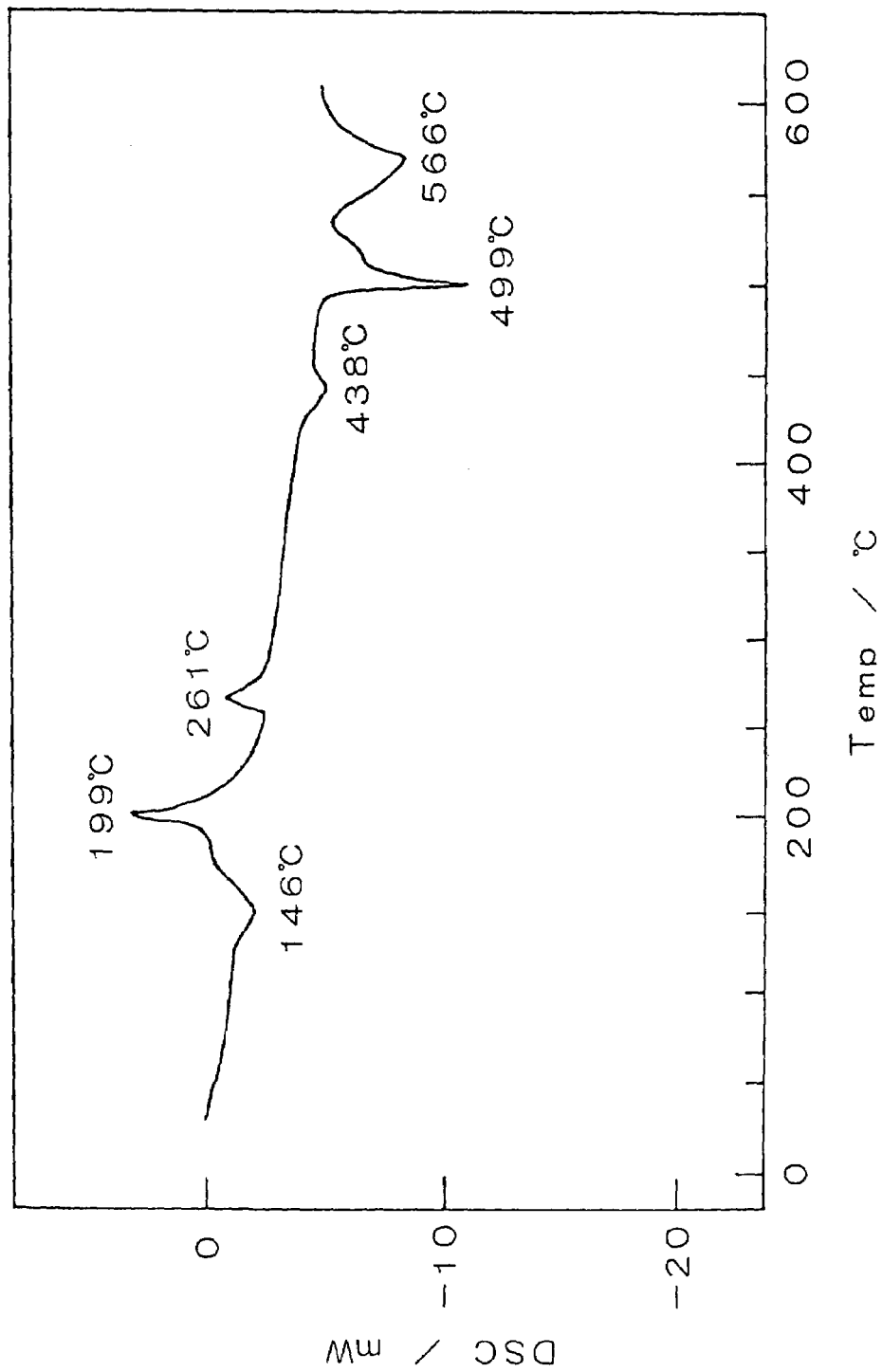

FUNCTIONAL ALLOY PARTICLES

This application is the national phase under 35 U.S.C. § 371 of PCT International Application No. PCT/JP01/08687 which has an International filing date of Oct. 2, 2001, which designated the United States of America.

BACKGROUND OF THE INVENTION

1. Field of the Invention

The present invention relates to functional metal alloy particles. More particularly, the present invention is concerned with functional metal alloy particles containing substantially no lead, each exhibiting a plurality of different melting points including an original lowest melting point (a) and a highest melting point, wherein each of the metal alloy particles exhibits the original lowest melting point (a) at least at a surface portion thereof, and wherein, when each metal alloy particle is heated at a temperature equal to or higher than the original lowest melting point (a) to melt at least a surface portion of each metal alloy particle which exhibits the original lowest melting point (a), followed by cooling to room temperature to thereby solidify the melted portion of each metal alloy particle, the resultant solid metal alloy particle having experienced the melting and solidification exhibits an elevated lowest melting point (a') higher than the original lowest melting point (a). The present invention is also concerned with a method for producing the metal alloy particles.

In the production of a conductive adhesive, an anisotropic conductive film, a soldering paste and the like, the metal alloy particles of the present invention can be advantageously used as a conductive filler which does not contain very poisonous lead used in conventional conductive fillers and, hence, exhibits high safety. Further, the metal alloy particles of the present invention have the following advantages. For example, when the conductive adhesive or soldering paste, each of which contains the metal alloy particles of the present invention as a conductive filler, is used for conductively connecting a semiconductor device or an electronic part to a substrate for an electronic circuit (hereinafter, a "substrate for an electronic circuit" is frequently referred to simply as a "substrate"), such as a printed circuit board (i.e., when the conductive adhesive or soldering paste is used for mounting the device or part on the substrate), the mounting is conducted by heat treatment to melt the conductive adhesive or soldering paste, which is deposited between the device or part and the substrate, followed by cooling to solidify the melted adhesive or paste. In such a case, by the use of the metal alloy particles of the present invention in the conductive adhesive or soldering paste, even when the above-mentioned heat treatment (hereinafter, referred to as the "initial heat treatment") for mounting is conducted at a temperature which is lower than a heating temperature conventionally employed for the mounting, the device or part can be securely mounted on the substrate. In addition, after the initial heat treatment for mounting, the metal alloy particles contained in the conductive adhesive or soldering paste exhibit an elevated lowest melting point higher than its original lowest melting point, so that, even when the substrate having mounted thereon the device or part is subjected to further heat treatment (conducted for mounting another device or part on the substrate) at the same temperature as employed for the initial heat treatment, the metal alloy particles contained in the conductive adhesive or soldering paste are not melted and, hence, it is possible to prevent displacement of the semiconductor device or electronic part (that is, the conductive adhesive or soldering paste has excellent reliability with respect to heat resistance). Further, the conductive adhesive or soldering paste is advantageous in that, even when the conductive adhesive or soldering paste is exposed to high temperature conditions, the conductive adhesive or soldering paste can maintain the stand-off between the semiconductor device or electronic part and the substrate. The term "stand-off" means a state in which the conductive adhesive or conductive solid formed from the soldering paste, which electrically connects the device or part to the substrate, maintains a desired thickness, thereby maintaining a desired distance between the substrate and the conductive adhesive or conductive solid formed from the soldering paste. When the thickness of the conductive adhesive or conductive solid formed from the soldering paste becomes too small (i.e., when the stand-off is not maintained), various disadvantages (such as short-circuiting) may occur. In the case of the anisotropic conductive film comprising the metal alloy particles of the present invention, the anisotropic conductive film has the following advantages. When the anisotropic conductive film is used for production of an electronic part comprising an anisotropic conductive film having disposed on each surface thereof a plurality of electrodes, wherein the electrodes are attached to the anisotropic conductive film by heat treatment, the anisotropic conductive film can be securely attached to the electrodes at heating temperatures which are lower than a conventionally employed temperature. In addition, even when the electrodes are disposed on the anisotropic conductive film in a fine-pitch (closely spaced) arrangement, a high current density and a high conductivity can be achieved. Therefore, the electronic part obtained can be advantageously used, for example, for producing a color liquid crystal panel having a high density.

2. Prior Art

In recent years, for alleviating the defects of electric lead wiring, which defects are caused due to the developments of multi-pitch and fine-pitch technologies used in the multi-chip module (MCM) or the quad flat package (QFP), various connection methods for mounting a semiconductor device or electronic part on a substrate for an electronic circuit have been proposed. Examples of such methods include a ball grid array (BGA) connection method, a chip size packaging (CSP) connection method, and a flip chip (FC) connection method using a conductive adhesive, an anisotropic conductive film (ACF) or an anisotropic conductive paste (ACP).

In any of the conventional connection methods, a conventional Sn/Pb eutectic solder (comprising 63% by weight of Sn and 37% by weight of Pb) has been mainly used. In the conventional connection methods, generally, a semiconductor device or an electronic part is conductively connected to a substrate (i.e., the device or part is mounted on the substrate) by a method in which an Sn/Pb eutectic solder is disposed between the device or part and the substrate, followed by heat treatment (to melt the solder) and subsequent cooling treatment (to solidify the melted solder) in a reflow furnace or the like (hereinafter, the heat treatment for mounting a semiconductor device or an electronic part to a substrate is frequently referred to simply as the "heat treatment for mounting").

With respect to an Sn/Pb eutectic solder ball, the solder ball itself is capable of forming an conductive connection. By virtue of this property, the Sn/Pb eutectic solder ball is used in the BGA connection method, the CSP connection method and the FC connection method.

Examples of manners for using the Sn/Pb eutectic solder ball in the BGA connection method, the CSP connection method or the FC connection method include: a manner in which the Sn/Pb eutectic solder ball is placed between a semiconductor device-containing electronic package and a substrate, followed by soldering the package on the substrate; and a manner in which a semiconductor device is directly soldered on an interposer (i.e., a substrate for an electronic package) using the Sn/Pb eutectic solder ball.

The Sn/Pb eutectic solder is a binary eutectic alloy and has a melting point of 183° C. (at which temperature, in the phase diagram of the Sn/Pb eutectic solder, the solidus curve intersects with the liquidus curve). Particles of the Sn/Pb eutectic solder are uniformly melted at temperatures which are higher than 183° C. Therefore, the use of the Sn/Pb eutectic solder ball in the above-mentioned connection methods is advantageous in that a semiconductor device and a substrate can be securely attached to each other at a relatively low temperature.

However, the Sn/Pb eutectic solder which has been used for soldering is re-melted at a temperature higher than the melting point thereof (i.e., 183° C.), so that Sn/Pb eutectic solder has a poor reliability with respect to heat resistance. More specifically, for example, in the case of a substrate on which a first electronic part is soldered using the Sn/Pb eutectic solder, when it is attempted to mount a second electronic part on the substrate by heat treatment, it is highly possible that the Sn/Pb eutectic solder used for soldering the first electronic part is re-melted, thereby causing displacement of the first electronic part.

In an attempt to prevent such re-melting and displacement of an electronic part, Unexamined Japanese Patent Application Laid-Open Specification No. Hei 10-6073, Unexamined Japanese Patent Application Laid-Open Specification No. 2000-210767 (corresponding to EP 1 002 612) and the like propose a method utilizing the metal diffusion phenomenon induced by heat. Specifically, in the method of these patent documents, an Sn/Au alloy is used for mounting electronic parts on a substrate (each of Sn and Au is relatively easy to diffuse in the alloy by heat treatment conducted for mounting), wherein the composition of the Sn/Au alloy is caused to change by the thermal diffusion of the metals during the heat treatment for mounting the electronic part on the substrate. In this method, it is attempted to elevate the melting point of the Sn/Au alloy by changing the composition thereof, so as to prevent the Sn/Au alloy from re-melting during the subsequent heat treatment for mounting another electronic part on the substrate. However, by this method, it is difficult to stably obtain a metal alloy having a desired composition after the thermal diffusion of the metals. If a metal alloy having a desired composition is stably obtained, this means that an intermetallic compound, which has a stable composition and a melting point higher than those of Sn and Au, is formed in the alloys after the thermal diffusion of the metals (Sn and Au), that is, it becomes possible to form a high melting point portion (composed of the above-mentioned intermetallic compound) in the alloy, which portion is not melted at the temperature generally employed for the above-mentioned heat treatment for mounting. However, on the other hand, the lowest melting point of the alloys remains unchanged even after the thermal diffusion of the metals. Therefore, when the substrate having mounted thereon the electronic parts is heated again at the temperature employed for the heat treatment for mounting, the alloy is re-melted at least at a portion thereof. Accordingly, the metal alloy has a poor reliability with respect to heat resistance.

Further, the above-mentioned method has the following disadvantage. In the method, the above-mentioned Sn/Au alloy is formed by interposing a laminate of a plurality of metal layers (including an Sn layer and an Au layer) between the electronic part and the substrate, followed by heating. After the formation of the Sn/Au alloy, the heating is continued, while strictly controlling the heating conditions, so as to adjust the composition of the Sn/Au alloy. Therefore, cumbersome operations are needed for practicing the method.

As seen from the above, there has not yet been known a conductive adhesive material having reliability with respect to heat resistance, which can be put into a practical use, and it has been desired to develop such a conductive adhesive material.

The above-mentioned Sn/Pb eutectic solder ball also has the following defect. When the Sn/Pb eutectic solder ball is caused to bear a load during the operation of attaching a semiconductor device to a substrate, the Sn/Pb eutectic solder ball is crushed. As a result, the Sn/Pb eutectic solder ball cannot maintain the stand-off between the semiconductor device and the substrate, and, in addition, the mutually adjacent Sn/Pb eutectic solder balls are bonded together and unified. The reason for this unification is that the Sn/Pb eutectic solder ball is uniformly melted by heating.

For overcoming the defects of Sn/Pb eutectic solder, it is attempted to obtain an Sn/Pb non-eutectic solder having a composition wherein the melting point of the Sn/Pb non-eutectic solder becomes higher than that of the Sn/Pb eutectic solder. However, this non-eutectic Sn/Pb solder has the following disadvantage. When the Sn/Pb non-eutectic solder is used, the temperature for soldering necessarily becomes high, as compared to that employed in the soldering using the Sn/Pb eutectic solder, so that it is likely that both of the semiconductor device and the substrate suffer undesired thermal influences, leading to a deterioration of the semiconductor device and/or the substrate. For avoiding such disadvantage, it is desired to use an Sn/Pb solder which can be used at a temperature of 250° C. or less.

Thus, it has been desired to develop a conductive adhesive material satisfying the following requirements:

(1) the conductive adhesive material should have heat resistance reliability, so that, even when the conductive adhesive material (which has been used for mounting an electronic part or the like on a substrate) is repeatedly subjected to heat treatment for mounting electronic parts and the like, the conductive adhesive material is capable of preventing displacement of the electronic part which has already been mounted on the substrate;

(2) the conductive adhesive material should have connection stability, that is, the conductive adhesive material should be capable of maintaining the stand-off between the electronic part and the substrate; and (3) the conductive adhesive material should be capable of strongly attaching an electronic part or the like to a substrate even by a heat treatment at a relatively low temperature (i.e., about 250° C. or less) which does not adversely affect the electronic part and the substrate.

As apparent from the above explanation of the prior art, a conductive adhesive material satisfying the requirement (1) above has not yet been developed. With respect to the requirements (2) and (3) above, a number of proposals have been made to alleviate the defects of the Sn/Pb eutectic solder and to develop a conductive adhesive material satisfying the requirement (2) or (3).

As an example of methods proposed to alleviate the above defects, there can be mentioned a method in which, for maintaining the stand-off between the semiconductor device and the substrate, very small balls of a high melting point metal, such as Au, Ag or Cu, are used instead of Sn/Pb eutectic solder balls. More specifically, in this method, the very small balls of a high melting point metal are interposed between the semiconductor device and the substrate, and the balls are bonded to the semiconductor device and the substrate using an Sn/Pb eutectic solder. However, in this method, it is necessary to prevent oxidation of the surfaces of the high melting point metal balls by, for example, plating or precoating the Sn/Pb eutectic solder, leading to a disadvantage that the mechanical strength of the solder connection between the semiconductor device and the substrate inevitably becomes poor. As a result, the semiconductor device is easily disconnected from the substrate even by a small load caused by a small impact, vibration or the like. Further, the high melting point metal is expensive and, hence, the use of the high melting point metal is disadvantageous also from an economical point of view.

In an attempt to maintain the stand-off between the semiconductor device and the substrate even when the heat treatment for mounting is repeatedly conducted by the use of a reflow furnace, a method is proposed which uses an Sn/Pb eutectic soldering paste having incorporated therein metal wires or metal particles (which would not get melt-mixed with the Sn/Pb eutectic solder even when the heat treatment for mounting is repeatedly conducted by the use of a reflow furnace) (see, for example, Unexamined Japanese Patent Application Laid-Open Specification Nos. Hei 2-134897 and Hei 7-171693). However, in this method, it is difficult to disperse metal wires or metal particles uniformly in the Sn/Pb eutectic soldering paste and, hence, it is difficult to maintain the stand-off between the semiconductor device and the substrate.

As another example of methods proposed to maintain the stand-off between the semiconductor device and the substrate even when the heat treatment for mounting is repeatedly conducted by the use of a reflow furnace, there can be mentioned a method which uses an Sn/Pb eutectic soldering paste containing, as a conductive filler, particles of metals (as simple substances) or a metal alloy, and in which a metal alloy is formed in the Sn/Pb eutectic soldering paste during the heat treatment of the paste in the reflow furnace by utilizing the difference in the ionization tendency between the metals in the Sn/Pb eutectic soldering paste. For example, Unexamined Japanese Patent Application Laid-Open Specification No. Hei 9-295182 uses Sn, Ag, Bi, In, Cu and Zn as the metals (as simple substances) and obtains an Sn/Ag alloy, an Sn/Cu alloy, an Sn/Bi alloy, an Sn/Zn alloy and Sn/In alloy.

Further, a method is known which uses an Sn/Pb eutectic soldering paste containing a metal alloy powder as a conductive filler, which metal alloy powder exhibits a plurality of melting points before the heat treatment thereof in the reflow furnace and exhibits a single melting point after the heat treatment thereof in the reflow furnace.

However, these methods are disadvantageous not only in that it is difficult to disperse the filler uniformly in the Sn/Pb eutectic soldering paste, but also in that the metal alloy obtained does not have a uniform composition due to the difference in specific gravity between the metals or alloys contained in the soldering paste. Further, the above Sn/Pb eutectic soldering paste after melting by the heat treatment thereof in the reflow furnace exhibits disadvantageously poor uniformity in composition, and disadvantageously poor reproducibility of composition. Therefore, these methods are not practicable.

Generally, in a phase diagram of a metal alloy, the metal alloy composition corresponding to a point at which the solidus curve intersects with the liquidus curve is a eutectic composition. A metal alloy having a eutectic composition exhibits a single melting point having substantially no temperature range. Therefore, such a metal alloy is uniformly melted at the melting point thereof. For example, as mentioned above, the Sn/Pb eutectic solder is uniformly melted at the melting point thereof (i.e., 183° C.). On the other hand, in the case of a metal alloy which does not have a eutectic composition (i.e., metal alloy having a composition corresponding to a point at which the solidus curve does not intersect with the liquidus curve), the metal alloy has either a single melting point having a temperature range (i.e., there is a difference between the lowest temperature at which a part of the metal alloy starts to melt and the lowest temperature at which the metal alloy finishes melting) or a plurality of melting points.

As examples of patent documents in which the use of a metal alloy having a plurality of melting points is described, there can be mentioned Unexamined Japanese Patent Application Laid-Open Specification Nos. Hei 9-174278 and Hei 9-206983. In these patent documents, it is attempted to lower a melting point of a solder containing no lead. However, the highest melting point of the solder containing no lead is lower than the temperature (230 to 250° C.) which is generally employed for mounting an electronic part on a substrate. Therefore, the solder cannot maintain the stand-off during the mounting of an electronic part on the substrate.

For the purpose of improving the connecting strength of a via hole conductor (which connects electronic parts to each other through a via hole), Unexamined Japanese Patent Application Laid-Open Specification No. Hei 11-214575 describes a method for producing a circuit board, which comprises: forming a via hole in an insulating layer; filling the via hole with a conductive paste (containing a high melting point filler) to form a via hole conductor having its both end portions exposed at both end openings of the via hole; applying a paste containing a low melting point alloy (such as an Sn/In alloy) on each of the end portions of the via hole conductor in a predetermined thickness; and placing a metal circuit layer on both sides of the insulating layer, followed by heating, to cause the low melting point alloy to form intermetallic compounds with the high melting point conductive filler (in the via hole conductor) and the metal circuit layer. However, the low melting point alloy has an invariable specific melting point, so that, when the obtained circuit board is re-heated at the same temperature for the formation of the intermetallic compounds, the low melting point alloy is inevitably melted. That is, the via hole conductor has a poor reliability with respect to heat resistance.

As apparent from the above, a conductive adhesive material satisfying the requirements of (1) to (3) above has not yet been developed by conventional methods.

Further, it should be noted that a solder containing lead, such as an Sn/Pb eutectic solder, has the following serious defects. Lead is very poisonous and, hence, a lead-containing solder is harmful to humans. Further, lead radiates α-rays, so that, when a lead-containing solder is placed near the semiconductor device, the solder may cause the malfunction of the semiconductor device. Therefore, the mounting of the semiconductor device must be conducted in a manner such that the lead-containing solder is kept away from the semiconductor device.

Thus, it has been desired to develop a conductive adhesive material satisfying the requirements of (1) to (3) above, which contains substantially no lead and which is free of the defects of the Sn/Pb eutectic solder.

SUMMARY OF THE INVENTION

In this situation, the present inventors have made extensive and intensive studies with a view toward developing an excellent conductive filler used in a conductive adhesive containing substantially no lead (which is very poisonous), which conductive adhesive is advantageous not only in that it can be used to attach a semiconductor device or electronic part securely to a substrate (i.e., to mount the device or part securely on the substrate) by heat treatment at temperatures which are lower than a heating temperature conventionally employed for mounting the device or part on the substrate, but also in that, even when the resultant substrate having the device or part mounted thereon is subjected to heating again for mounting another device or part on the substrate, the metal alloy particles are not melted and, hence, it is possible to prevent displacement of the semiconductor device or electronic part mounted on the substrate (that is, the conductive adhesive has reliability with respect to heat resistance). As a result, it has unexpectedly been found that specific metal alloy particles can be used as an excellent conductive filler. The above-mentioned specific metal alloy particles are metal alloy particles containing substantially no lead, each exhibiting a plurality of different melting points including an original lowest melting point (a) and a highest melting point, wherein each of the metal alloy particles exhibits the original lowest melting point (a) at least at a surface portion thereof, and wherein, when each metal alloy particle is heated at a temperature equal to or higher than the original lowest melting point (a) to melt at least a surface portion of each metal alloy particle which exhibits the original lowest melting point (a), followed by cooling to room temperature to thereby solidify the melted portion of each metal alloy particle, the resultant solid metal alloy particle having experienced the melting and solidification exhibits an elevated lowest melting point (a') higher than the original lowest melting point (a).

It has also been found that, when the metal alloy particles contain specific types of metals in specific amounts, such specific metal alloy particles can be advantageously used for preparing a conductive adhesive having have an ability to provide an excellent reworkability with respect to a substrate and an electronic part (which means, for example, the recyclabilty of a substrate from which an electronic part having been mounted on the substrate has been removed) which has conventionally been sacrificed for improving the adhesive property of the conductive adhesive. Based on these findings, the present invention has been completed.

Accordingly, it is a primary object of the present invention to provide metal alloy particles which can be used as an excellent conductive filler for use in a conductive adhesive containing substantially no lead (which is very poisonous), wherein the conductive adhesive is advantageous not only in that is can be used for mounting a semiconductor device or electronic part securely on a substrate by heat treatment at temperatures which are lower than a heating temperature conventionally employed for mounting a semiconductor device or an electronic part on a substrate, but also in that, when the resultant substrate having the device or part mounted thereon is subjected to heating again for mounting another device or part on the substrate, the metal alloy particles are not melted and, hence, it is possible to prevent displacement of the semiconductor device or electronic part mounted on the substrate (that is, the conductive adhesive has reliability with respect to heat resistance).

It is another object of the present invention to provide a method for producing the metal alloy particles.

It is still another object of the present invention to provide a conductive adhesive, a soldering paste and an anisotropic conductive film, each of which contains the metal alloy particles as a conductive filler.

The foregoing and other objects, features and advantages of the present invention will be apparent from the following detailed description and appended claims taken in connection with the accompanying drawings.

Figure 1:
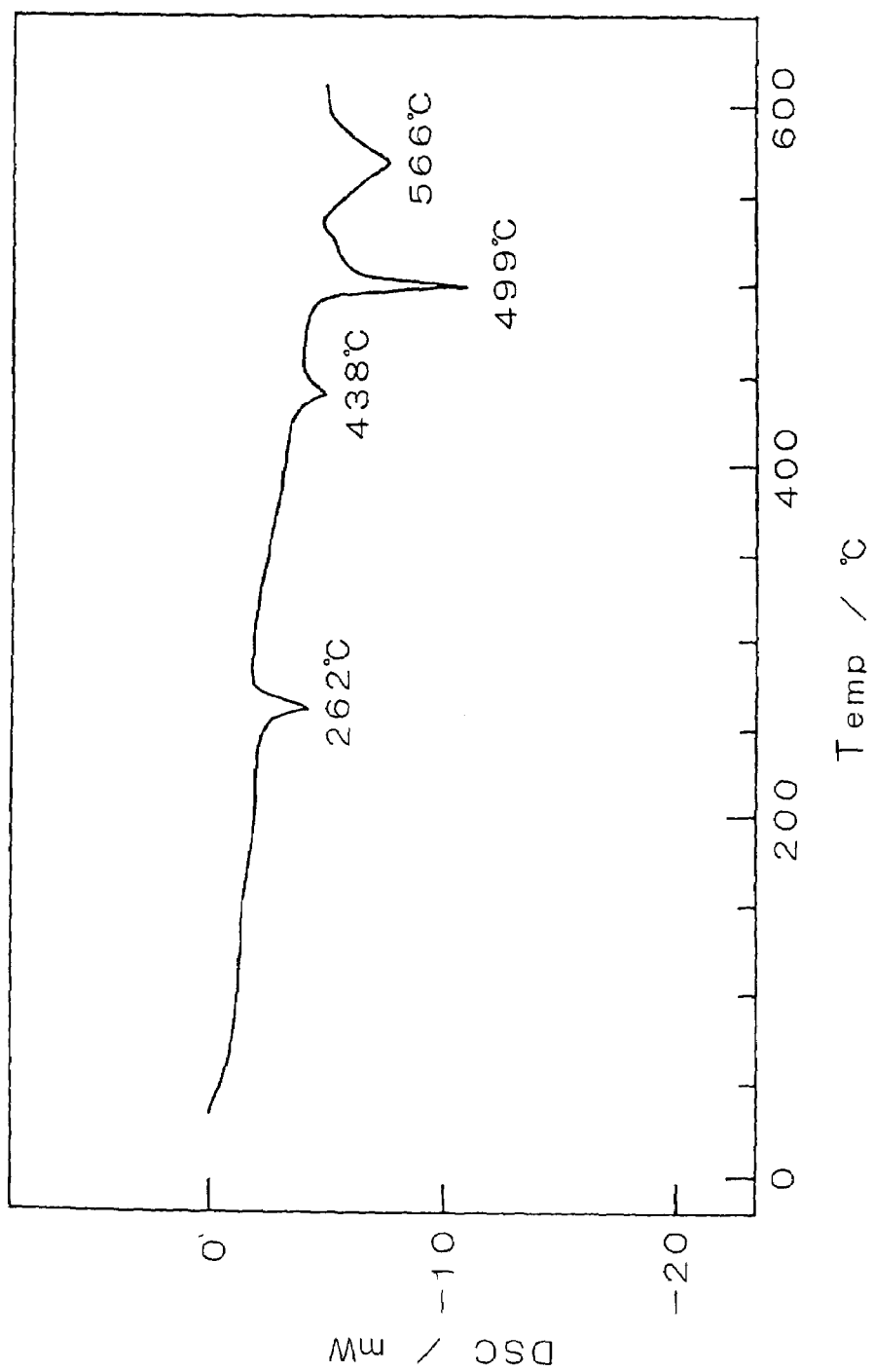
FIG. 1(a) is a differential scanning calorimetry (DSC) chart of the metal alloy particles obtained in Example. 1, wherein the DSC is conducted before melting of the metal alloy particles.
FIG. 1(b) is a DSC chart of the metal alloy particles obtained in Example 1, wherein the DSC is conducted after melting and solidification of the metal alloy particles.
Figure 2:
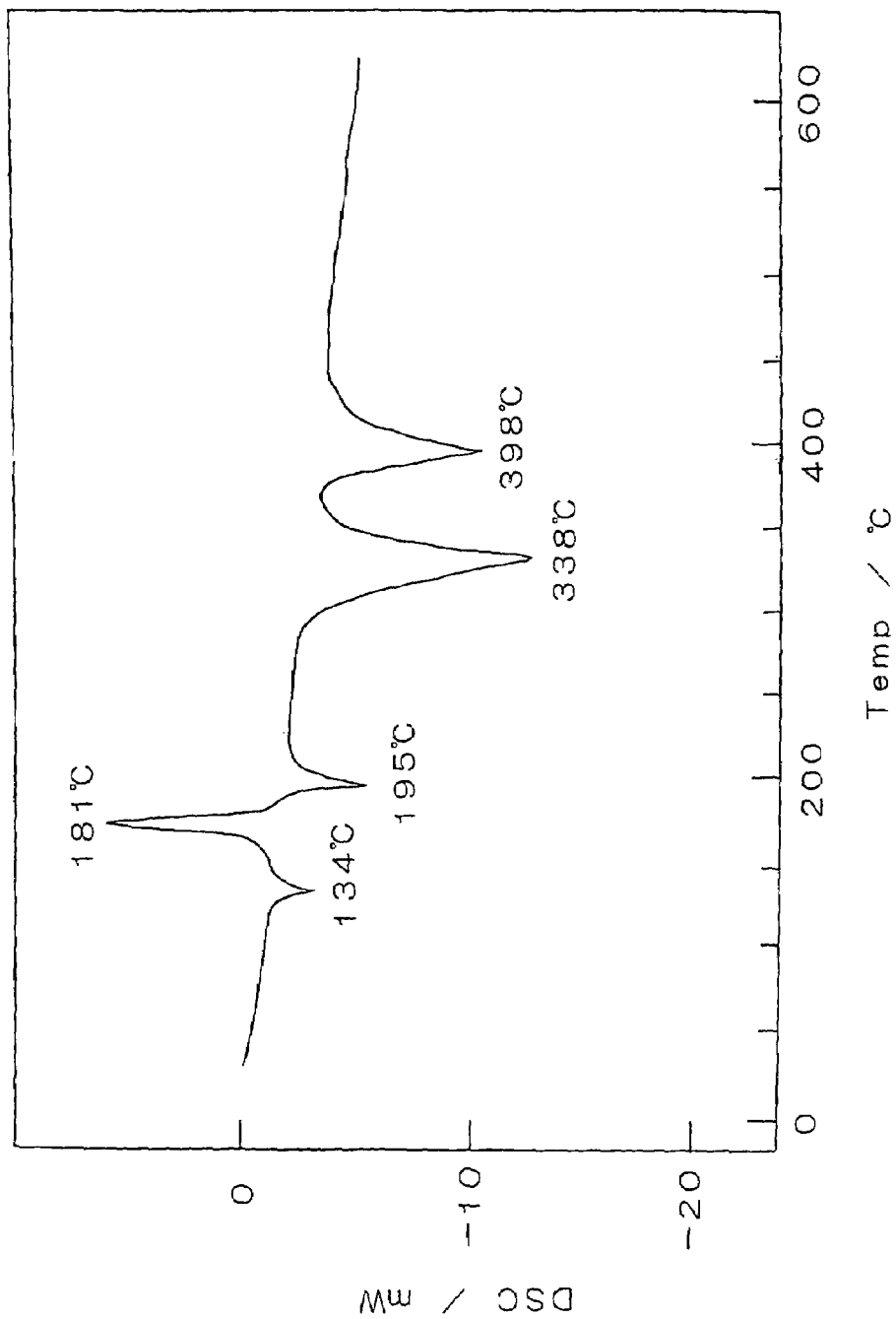
FIG. 2(a) is a DSC chart of the metal alloy particles obtained in Example 2, wherein the DSC is conducted before melting of the metal alloy particles.
FIG. 2(b) is a DSC chart of the metal alloy particles obtained in Example 2, wherein the DSC is conducted after melting and solidification of the metal alloy particles.
Figure 2:
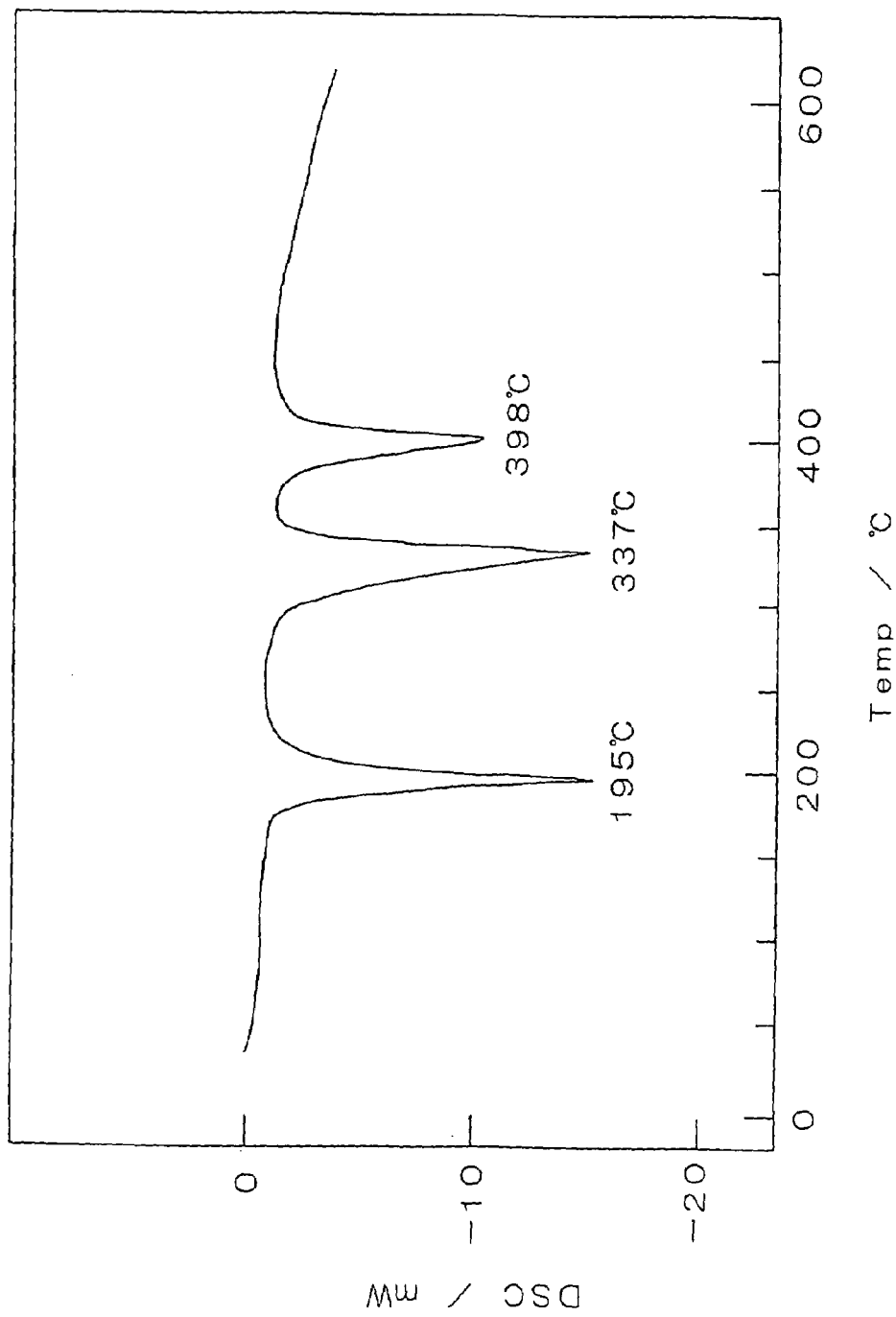
Figure 3:
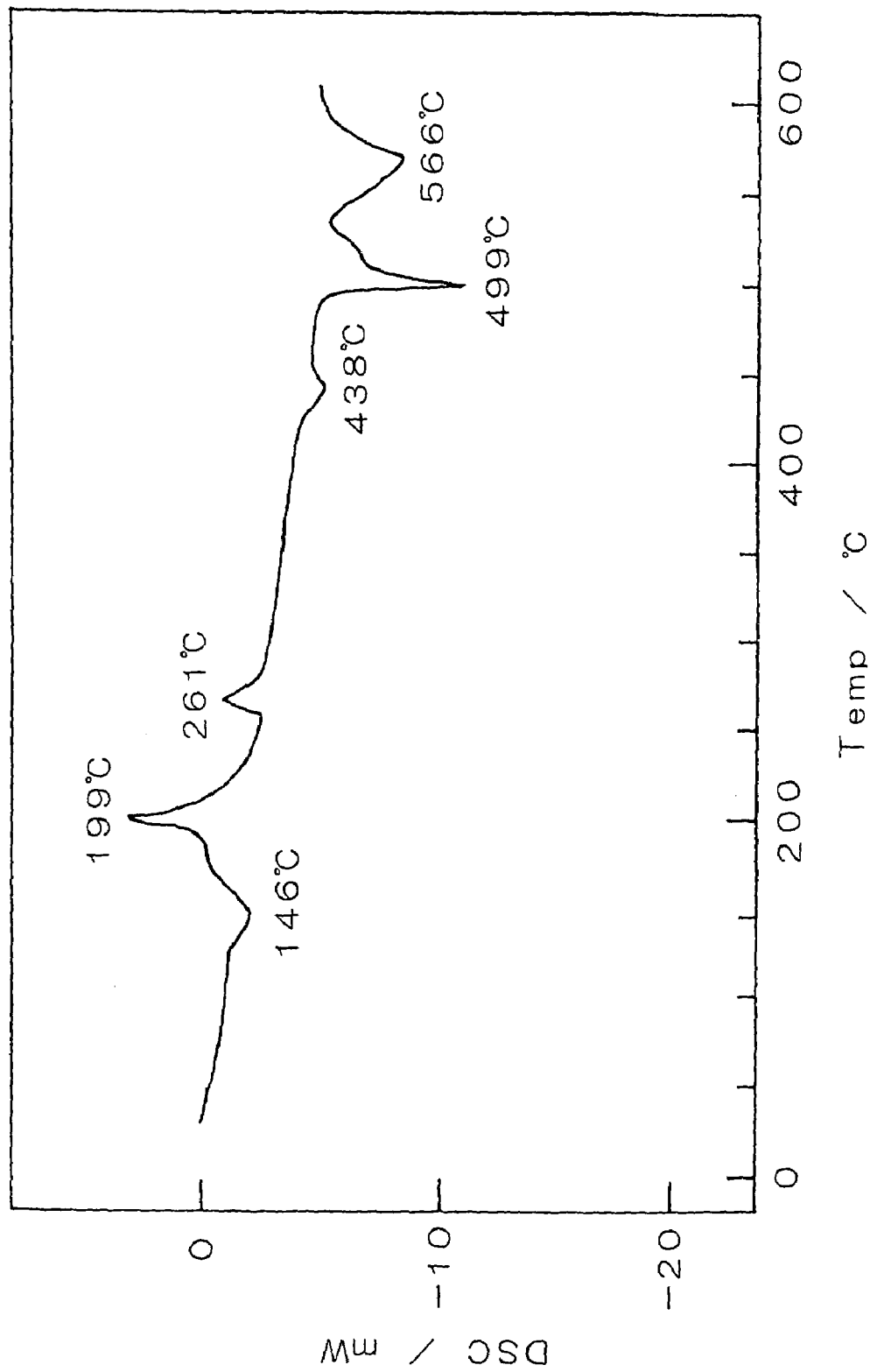
FIG. 3(a) is a DSC chart of the metal alloy particles obtained in Example 3, wherein the DSC is conducted before melting of the metal alloy particles.
FIG. 3(b) is a DSC chart of the metal alloy particles obtained in Example 3, wherein the DSC is conducted after melting and solidification of the metal alloy particles.
Figure 3:
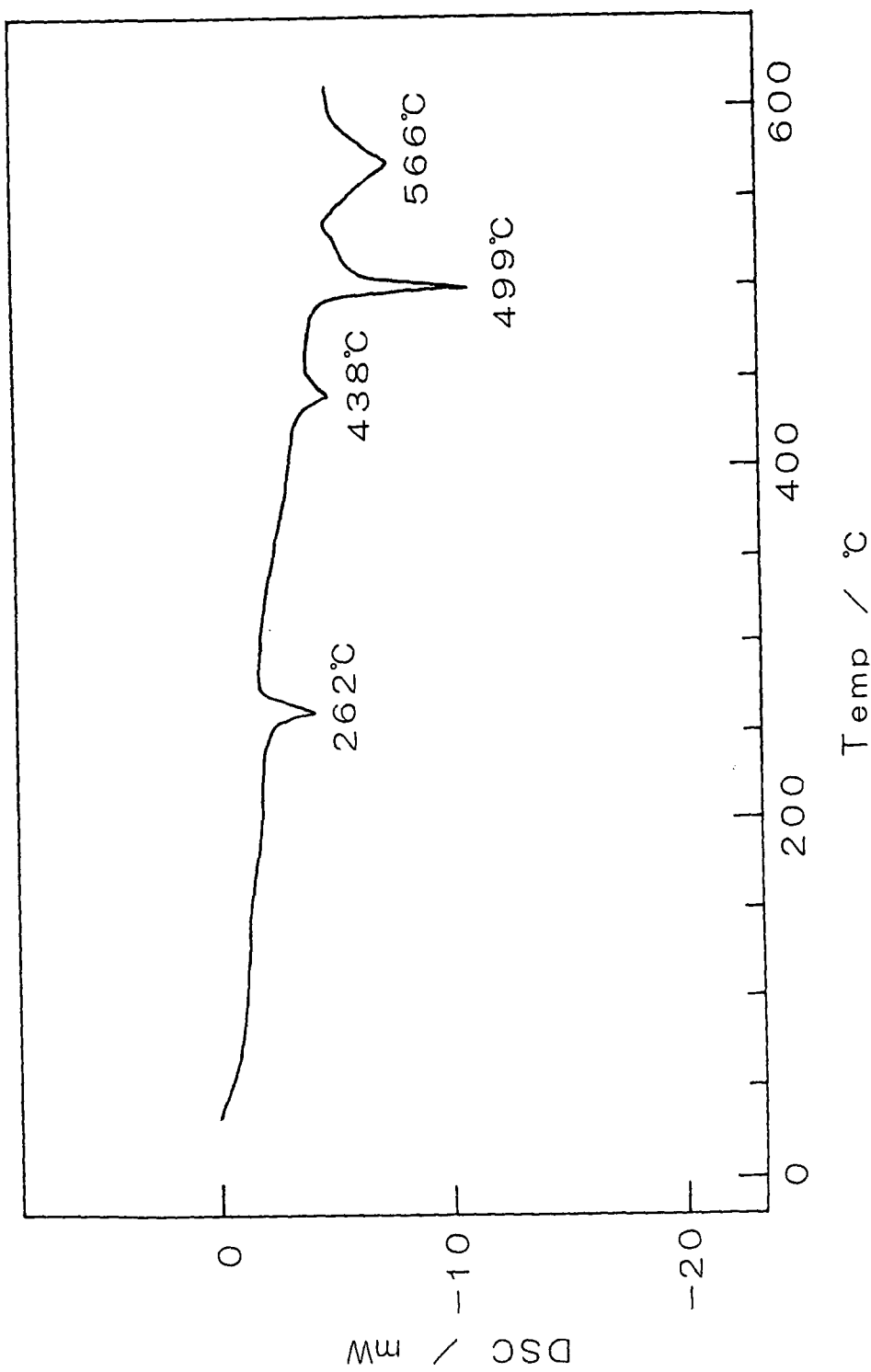

In each of FIG. 1(a) to FIG. 3(b), the abscissa shows the temperature (° C.), the ordinate shows the DSC (mW), a concave peak shows an endothermic peak, and a convex peak shows an exothermic peak.

DETAILED DESCRIPTION OF THE INVENTION

According to the present invention, there is provided metal alloy particles containing substantially no lead, each exhibiting a plurality of different melting points, as measured by differential scanning calorimetry (DSC) and identified as temperatures at which endothermic peaks are observed in the DSC, the plurality of different melting points including an original lowest melting point (a) and a highest melting point, wherein, when the metal alloy particles are subjected to DSC, at least one exothermic peak is observed in the DSC, wherein each of the metal alloy particles exhibits the original lowest melting point (a) at least at a surface portion thereof, and wherein, when each metal alloy particle is heated at a temperature equal to or higher than the original lowest melting point (a) to melt at least a surface portion of each metal alloy particle which exhibits the original lowest melting point (a), followed by cooling to room temperature to thereby solidify the melted portion of each metal alloy particle, the resultant solid metal alloy particle having experienced the melting and solidification exhibits an elevated lowest melting point (a') higher than the original lowest melting point (a).

For easy understanding of the present invention, the essential features and various preferred embodiments of the present invention are enumerated below.

1. Metal alloy particles containing substantially no lead, each exhibiting a plurality of different melting points, as measured by differential scanning calorimetry (DSC) and identified as temperatures at which endothermic peaks are observed in the DSC, the plurality of different melting points including an original lowest melting point (a) and a highest melting point, wherein, when the metal alloy particles are subjected to DSC, at least one exothermic peak is observed in the DSC, wherein each of the metal alloy particles exhibits the original lowest melting point (a) at least at a surface portion thereof, and wherein, when each metal alloy particle is heated at a temperature equal to or higher than the original lowest melting point (a) to melt at least a surface portion of each metal alloy particle which exhibits the original lowest melting point (a), followed by cooling to room temperature to thereby solidify the melted portion of each metal alloy particle, the resultant solid metal alloy particle having experienced the melting and solidification exhibits an elevated lowest melting point (a') higher than the original lowest melting point (a).

2. The metal alloy particles according to item 1 above, wherein the elevated lowest melting point (a') is at least 2° C. higher than the original lowest melting point (a).

3. The metal alloy particles according to item 1 or 2 above, wherein the original lowest melting point (a) is in the range of from 40 to 250° C.

4. The metal alloy particles according to item 1 or 2 above, wherein each metal alloy particle comprises (i) a lowest melting point alloy phase exhibiting the original lowest melting point (a) within the range of from 40 to 250° C., and (ii) a high melting point alloy phase exhibiting a melting point higher than 250° C., the lowest melting point alloy phase (i) being positioned within a distance of 0.2 r from the surface of the particle, wherein r represents the radius of the metal alloy particle.

5. The metal alloy particles according to item 4 above, wherein each metal alloy particle further comprises (i') a low melting point alloy phase exhibiting an original melting point (b), as measured before the heating, which is within the range of from 40 to 250° C., with the proviso that the original melting point (b) is higher than the original lowest melting point (a), the low melting point alloy phase (i') being positioned within a distance of 0.2 r from the surface of the particle, wherein r represents the radius of the metal alloy particle.

7. The metal alloy particles according to item 1 or 2 above, wherein each metal alloy particle comprises, as a first metal species, Cu and Sn; as a second metal species, at least two metals selected from the group consisting of Ag, Bi, In and Zn; and, as a third metal species, at least one metal selected from the group consisting of Sb, Al, Ga, Au, Si, Ge, Co, W, Ta, Ti, Ni, Pt, Mg, Mn, Mo, Cr and P.

8. The metal alloy particles according to item 7 above, wherein:

the content of Cu as the first metal species in each metal alloy particle is in the range of from 10 to 90% by weight, the content of Sn as the first metal species in each metal alloy particle is in the range of from 5 to 80% by weight, when each metal alloy particle comprises Ag as the second metal species, the content of Ag in each metal alloy particle is in the range of from 0.5 to 20% by weight, when each metal alloy particle comprises Bi as the second metal species, the content of Bi in each metal alloy particle is in the range of from 0.5 to 15% by weight, when each metal alloy particle comprises In as the second metal species, the content of In in each metal alloy particle is in the range of from 0.5 to 15% by weight, when each metal alloy particle comprises Zn as the second metal species, the content of Zn in each metal alloy particle is in the range of from 1 to 5% by weight, and the total content of the third metal species in each metal alloy particle is in the range of from 0.01 to 3% by weight.

9. A method for producing the metal alloy particles of item 1 or 2 above, which comprises:

(1) providing a raw material mixture of a plurality of different materials selected from the group consisting of metals and metal alloys, the raw material mixture being capable of forming a metal alloy, (2) heat-melting the raw material mixture in an inert gas atmosphere to obtain a molten raw material mixture, (3) atomizing the molten raw material mixture, while quenching, to obtain solid metal alloy precursor particles, wherein, the solid metal alloy precursor particles exhibit at least one exothermic peak when metal alloy particles obtained in the subsequent step (4) are subjected to differential scanning calorimetry (DSC), and (4) subjecting each solid metal alloy precursor particle to a surface treatment with at least one metal having a low melting point, wherein the surface treatment is conducted by a method selected from the group consisting of plating, sputtering, vacuum evaporation, spray coating and dipping, thereby obtaining metal alloy particles.

10. The method according to item 9 above, wherein the raw material mixture comprises, as a first metal species, Cu and Sn; as a second metal species, at least two metals selected from the group consisting of Ag, Bi, In and Zn; and, as a third metal species, at least one metal selected from the group consisting of Sb, Al, Ga, Au, Si, Ge, Co, W, Ta, Ti, Ni, Pt, Mg, Mn, Mo, Cr and P, and wherein the at least one metal used for the surface treatment is selected from the group consisting of Sn, In and Bi.

11. The method according to item 9 above, which further comprises heating the metal alloy particles obtained in step (4) in an atmosphere of inert gas containing a reducing gas in a concentration of from 0.001 to 49% by volume, based on the total volume of the inert gas and the reducing gas, the reducing gas being at least one gas selected from the group consisting of hydrogen gas, carbon monoxide gas, methane gas and hydrogen sulfide gas.

12. A conductive adhesive comprising:

(1) the metal alloy particles of item 1 or 2 above as a conductive filler, the metal alloy particles exhibiting the original lowest melting point (a), (2) an organic binder comprising a thermoplastic resin and a thermocurable resin, and (3) a curing agent for the organic binder, wherein the organic binder has a curing temperature wherein the original lowest melting point (a) of the metal alloy particles is in the range of the curing temperature of the organic binder ±50° C.

13. The conductive adhesive according to item 12 above, wherein the amount of the metal alloy particles as a conductive filler is 70 to 95% by weight, based on the total weight of the metal alloy particles and the organic binder, and the amount of the thermoplastic resin contained in the organic binder is 3 to 97% by weight, based on the total weight of the thermoplastic resin and the thermocurable resin, and wherein the metal alloy particles as a conductive filler have an average particle diameter of from 0.1 to 20 μm, and each of the metal alloy particles has an oxygen content of 10,000 ppm or less.
14. The conductive adhesive according to item 12 above, wherein the thermoplastic resin is a resin having a group capable of forming a hydrogen bond and the thermocurable resin is at least one resin selected from the group consisting of an epoxy resin, a phenolic resin, a polyimide resin, a polyurethane resin, a melamine resin and a urea resin.
15. The conductive adhesive according to item 12 above, wherein the thermocurable resin is compatible with the thermoplastic resin.
16. The conductive adhesive according to item 15 above, wherein the thermoplastic resin is a phenoxy resin and the thermocurable resin is an epoxy resin.
17. An anisotropic conductive film comprising:
    (1) 1 part by weight of the metal alloy particles of item 1 or 2 above as a conductive filler, the metal alloy particles exhibiting the original lowest melting point (a), and
    (2) 0.05 to 300 parts by weight of an organic binder, wherein the organic binder has a curing temperature wherein the original lowest melting point (a) of the metal alloy particles is in the range of the curing temperature of the organic binder ±50° C.
18. The anisotropic conductive film according to item 17 above, wherein the metal alloy particles as a conductive filler have an average particle diameter of from 0.1 to 20 μm, and each of the metal alloy particles has an oxygen content of 10,000 ppm or less.
19. The anisotropic conductive film according to item 17 above, wherein the organic binder comprises at least one resin selected from the group consisting of a thermocurable resin, a thermoplastic resin, a photocurable resin, an electron radiation curable resin and a photothermocurable resin.
20. An electronic part comprising:
    (1) a substrate having disposed on a surface thereof a plurality of electrodes (A),
    (2) a flexible insulating film having disposed on a surface thereof a plurality of electrodes (B), and
    (3) the anisotropic conductive film of item 17 above disposed between the electrodes (A) and the electrodes (B), wherein two opposite surfaces of the anisotropic conductive film face the electrodes (A) and the electrodes (B), respectively,
    wherein each electrode (A) and each electrode (B) are, respectively, an anode and a cathode, or a cathode and an anode, and
    wherein the anisotropic conductive film disposed between the electrodes (A) and the electrodes (B) exhibits an anisotropic electrical conductivity.
21. The electronic part according to item 20 above, wherein each electrode (B) disposed on the flexible insulating film is independently selected from the group consisting of a Cu electrode, an Al electrode, an Au electrode, an Ag electrode, a Pt electrode, a Pd electrode, an Ag—Pd electrode, an Sn—Pb electrode, an Sn—Pb—Bi electrode, an Au—Pt electrode, an Ni electrode, an Au-plated Ni electrode, a Cu—Ag alloy electrode, an Ag—Pt electrode, an Sn/Pb solder-plated Cu electrode, and an Sn/Pb solder-plated Al electrode.
22. The electronic part according to item 20 or 21 above, wherein the substrate is selected from the group consisting of a printed circuit board, a hybrid IC board and a substrate for a liquid crystal panel.
23. A soldering paste comprising:
    (1) the metal alloy particles of item 1 or 2 above, as a conductive filler, the metal alloy particles exhibiting the original lowest melting point (a), and
    (2) a flux,
    wherein the flux has a volatilizing temperature wherein the original lowest melting point (a) of the metal alloy particles is in the range of the volatilizing temperature of the flux ±50° C.
24. An electronic part-mounted substrate obtained by mounting an electronic part on a substrate using the soldering paste of item 23 above.

Hereinbelow, the present invention is described in detail.

The metal alloy particles of the present invention contain substantially no lead. The term "contain substantially no lead" means that the lead content of the metal alloy particles is not more than 0.01% by weight. It is preferred that the lead content is as small as possible.

The composition of the metal alloy particles can be measured by means of an inductively coupled plasma atomic emission spectrometer. The lead content of the metal alloy particles can also be measured by means of the inductively coupled plasma atomic emission spectrometer.

Each of the metal alloy particles of the present invention exhibits a plurality of different melting points including an original lowest melting point (a) and a highest melting point, as measured by differential scanning calorimetry (DSC) and identified as temperatures at which endothermic peaks are observed in the DSC. It is preferred that the original lowest melting point (a) of the metal alloy particle is in the range of from 40 to 250° C. It is preferred that the highest melting point of the metal alloy particle is 1,100° C. or less.

A DSC chart obtained by the above-mentioned DSC shows the endothermic peaks and exothermic peak(s) of the metal alloy particle. In the present invention, the exothermic peak(s) of the metal alloy particle is/are not regarded as the melting point(s) of the metal alloy particle.

It is considered that the number of the melting points of the metal alloy particle corresponds to the number of the types of alloy phases present in the metal alloy particle. For example, when the metal alloy particle has three different melting points, it is considered that the metal alloy particle has three types of alloy phases. In the present invention, the metal alloy particle may have a plurality of alloy phases of the same type (i.e., a plurality of alloy phases having the same composition), which alloy phases may be dispersed in the metal alloy particle.

It is required that each of the metal alloy particles of the present invention exhibit the original lowest melting point (a) at least at a surface portion thereof. Therefore, when the metal alloy particles are heated at the original lowest melting point (a), the metal alloy particles are melt-bonded to each other at surface portions thereof. It is possible that the temperature at which the metal alloy particles are melt-bonded to each other slightly varies depending on the measurement conditions, such as the rate at which the temperature of the metal alloy particles is elevated. Taking this possibility into consideration, even when the metal alloy particles are melt-bonded to each other at a temperature which is higher or lower than the original lowest melting point (a) but is within the range of the original lowest melting point (a) ±20° C., the metal alloy particles are considered to be melt-bonded to each other at the original lowest melting point (a). Whether or not the metal alloy particles are melt-bonded to each other can be observed by means of a scanning electron microscope.

In the present invention, when each metal alloy particle is heated at a temperature equal to or higher than the original lowest melting point (a) to melt at least a surface portion of each metal alloy particle which exhibits the original lowest melting point (a), followed by cooling to room temperature to thereby solidify the melted portion of each metal alloy particle, the resultant solid metal alloy particle having experienced the melting and solidification exhibits an elevated lowest melting point (a') higher than the original lowest melting point (a).

The elevation of the lowest melting point of the metal alloy particles can be confirmed as follows. The metal alloy particles prior to the melting and subsequent solidification are subjected to DSC to obtain a DSC chart (hereinafter, this DSC chart is referred to as a "first DSC chart"). Then, the metal alloy particles are heated at a temperature equal to or higher than the original lowest melting point (a) to melt the sample, followed by solidification. The resultant metal alloy particles having experienced the melting and solidification are subjected to DSC to obtain a DSC chart (hereinafter, this DSC chart is referred to as a "second DSC chart"). If the lowest endothermic peak temperature of the second DSC chart is higher than that of the first DSC chart, the elevation of the lowest melting point of the metal alloy particles is confirmed.

In the present invention, the number of endothermic peaks of the second chart may be smaller than that of endothermic peaks of the first DSC chart, so long as the lowest endothermic peak temperature of the second DSC chart is higher than that of the first DSC chart. For example, when the endothermic peak temperatures of the first DSC chart are 134° C., 195° C., 338° C. and 398° C., and the endothermic peak temperatures of the second DSC chart are 195° C., 337° C. and 398° C., the original lowest melting point (a) is 134° C. (which is the lowest endothermic peak temperature of the first DSC chart) and the elevated lowest melting point (a') is 195° C. (which is the lowest endothermic peak temperature of the second DSC chart).

In the present invention, it is preferred that the elevated lowest melting point (a') is at least 2° C. higher, more advantageously 30° C. higher, than the original lowest melting point (a). It is preferred that the original lowest melting point (a) is in the range of from 40 to 250° C.

It is preferred that each of the metal alloy particles of the present invention comprises (i) a lowest melting point alloy phase exhibiting the original lowest melting point (a) within the range of from 40 to 250° C., and (ii) a high melting point alloy phase exhibiting a melting point higher than 250° C., wherein the lowest melting point alloy phase (i) is positioned within a distance of 0.2 r from the surface of the particle wherein r represents the radius of the metal alloy particle. When such metal alloy particles are heated at a temperature which is equal to or higher than the original lowest melting point (a) and which is 250° C. or less, the above-mentioned high melting point alloy phase (ii) remains solid. Therefore, as described below, when such metal alloy particles are used as a conductive filler in a conductive adhesive, an anisotropic conductive film or a soldering paste, the conductive adhesive, anisotropic conductive film or soldering paste exhibits excellent connection stability.

In the present invention, it is preferred that, in addition to the above-mentioned lowest melting point alloy phase (i) and high melting point alloy phase (ii), each of the metal alloy particles comprises (i') a low melting point alloy phase exhibiting an original melting point (b), as measured before the heating, which is within the range of from 40 to 250° C., with the proviso that the original melting point (b) is higher than the original lowest melting point (a), wherein the low melting point alloy phase (i') is positioned within a distance of 0.2 r from the surface of the particle wherein r represents the radius of the metal alloy particle.

Each of the metal alloy particles of the present invention is spherical or substantially spherical. Therefore, with respect to a peripheral portion of the metal alloy particle, which ranges from the surface of the particle to the depth of 0.2 r from the surface of the particle wherein r represents the radius of the metal alloy particle, the volume fraction of the peripheral portion in the metal alloy particle is 49%. This is confirmed by the following calculation:

$$((4\pi r^3/3) - (4\pi(0.8r)^3/3))/(4\pi r^3/3) = 1 - (0.8)^3$$
$$= 0.49.$$

When a peripheral portion of the metal alloy particle, which ranges from the surface of the particle to the depth of t from the surface of the particle wherein t represents a positive number smaller than the radius r of the metal alloy particle, is defined as D(t), it is preferred that the above-mentioned lowest melting point alloy phase (i) is present in peripheral portion D(t) having a volume fraction of from 10 to 14%, more advantageously from 15 to 30%.

The morphology of the metal alloy particles can be observed as follows. The metal alloy particles are fixed onto an aluminum board by using a carbon tape. Then, the morphology of particles is observed by means of a scanning electron microscope.

As mentioned below, from the viewpoint of using the metal alloy particles of the present invention as a conductive filler, it is preferred that each of the metal alloy articles has an oxygen content of 10,000 ppm or less, more advantageously 8,000 ppm or less, most advantageously 6,000 ppm or less.

The oxygen content of the metal alloy particles can be measured by means of an oxygen/nitrogen analyzer in accordance with the inert gas impulse melting method.

With respect to the types of metals used in the metal alloy particles of the present invention, an explanation is made below.

As mentioned above, the metal alloy particles of the present invention contain substantially no lead.

It is preferred that each of the metal alloy particles of the present invention comprises, as a first metal species, Cu and Sn; as a second metal species, at least two metals selected from the group consisting of Ag, Bi, In and Zn; and, as a third metal species, at least one metal selected from the group consisting of Sb, Al, Ga, Au, Si, Ge, Co, W, Ta, Ti, Ni, Pt, Mg, Mn, Mo, Cr and P. (In general, P is not regarded as a metal. However, the metal alloy particles of the present invention may contain P as a component thereof and, hence, P is regarded as a metal in the present invention.) Hereinafter, such a metal alloy particle is frequently referred to simply as a "Cu—Sn type alloy particle".

The content of Cu as a first metal species in the Cu—Sn type alloy particle is preferably from 10 to 90% by weight, more preferably from 20 to 80% by weight, most preferably from 30 to 70% by weight. When the Cu content of the Cu—Sn type alloy particle is less than 10% by weight, a conductive adhesive containing the Cu—Sn type alloy particles tends to have an unsatisfactory adhesion strength. On the other hand, when the Cu content of the Cu—Sn type alloy particle is more than 90% by weight, a conductive adhesive containing the Cu—Sn type alloy particles also tends to have an unsatisfactory adhesion strength.

The content of Sn as a first metal species in the Cu—Sn type alloy particle is preferably from 5 to 80% by weight, more preferably from 10 to 60% by weight, most preferably from 20 to 50% by weight. When the Sn content of the Cu—Sn type alloy particle is less than 5% by weight, a conductive adhesive containing the Cu—Sn type alloy particles tends to have an unsatisfactory adhesion strength. On the other hand, when the Sn content of the Cu—Sn type alloy particle is more than 80% by weight, a conductive adhesive containing the Cu—Sn type alloy particles also tends to have an unsatisfactory adhesion strength. Further, when the Sn content of the Cu—Sn type alloy particle is more than 80% by weight, a conductive adhesive containing the Cu—Sn type alloy particles tends to exhibit a slightly poor adhesion property at low temperatures.

The metal Ag as a second metal species in the Cu—Sn type alloy particle has a strong tendency to form a low melting point alloy phase with Sn. Further, Ag is expensive. In view of these facts, when the Cu—Sn type alloy particle contains Ag, the Ag content of the Cu—Sn type alloy particle is preferably from 0.5 to 20% by weight, more preferably from 5 to 15% by weight.

With respect to Bi as a second metal species in the Cu—Sn type alloy particle, this metal also has a strong tendency to form a low melting point alloy phase with Sn, and is hard and brittle. In view of these facts, when the Cu—Sn type alloy particle contains Bi, the Bi content of the Cu—Sn type alloy particle is preferably from 0.5 to 15% by weight, more preferably from 2 to 10% by weight.

With respect to In as a second metal species in the Cu—Sn type alloy particle, this metal has a strong tendency to form a low melting point alloy phase with any of Sn, Ag and Bi. Further, In is expensive. In view of these facts, when the Cu—Sn type alloy particle contains In, the In content of the Cu—Sn type alloy particle is preferably from 0.5 to 15% by weight, more preferably from 2 to 10% by weight.

With respect to Zn as a second metal species in the Cu—Sn type alloy particle, this metal is very susceptible to oxidation. The presence of an oxide of Zn in a conductive adhesive is likely to cause a lowering of various properties of the conductive adhesive. In view of these facts, when the Cu—Sn type alloy particle contains Zn, the Zn content of the Cu—Sn type alloy particle is preferably from 1 to 5% by weight, more preferably from 1 to 3% by weight.

The total content of the third metal species in the Cu—Sn type alloy particle is preferably from 0.01 to 3% by weight, more preferably from 0.01 to 1% by weight. As mentioned above, the Cu—Sn type alloy particle contains, as a third metal species, at least one metal selected from the above-mentioned 17 types of metals. In order to form desired alloy phases (such as the lowest melting point alloy phase (i) and the high melting point alloy phase (ii)) stably, it is preferred that the number of the types of the third metal species contained in the Cu—Sn type alloy particle is as small as possible. Specifically, as the third metal species, it is preferred to use one to three types of metals selected from the group consisting of Au, Ni, Pt, Co, Ga and Ge.

Thus, as preferred compositions for the Cu—Sn type alloy particles, there can be mentioned compositions in a broad sense, in which: the content of Cu as the first metal species is in the range of from 10 to 90% by weight; the content of Sn as the first metal species is in the range of from 5 to 80% by weight; when the metal alloy particle comprises Ag as the second metal species, the content of Ag is in the range of from 0.5 to 20% by weight; when the metal alloy particle comprises Bi as the second metal species, the content of Bi is in the range of from 0.5 to 15% by weight; when the metal alloy particle comprises In as the second metal species, the content of In is in the range of from 0.5 to 15% by weight; when the metal alloy particle comprises Zn as the second metal species, the content of Zn is in the range of from 1 to 5% by weight; and the content of the third metal species is in the range of from 0.01 to 3% by weight. The Cu—Sn type alloy particles are hereinafter, frequently referred to simply as "specific Cu—Sn type alloy particles". The use of specific Cu—Sn type alloy particles in the below-mentioned anisotropic conductive film has various advantages. For example, even when Ag—containing Cu—Sn type alloy particles are used in the anisotropic conductive film, the anisotropic conductive film exhibits high resistance to silver migration (i.e., the anisotropic conductive film is capable of suppressing short-circuiting between mutually adjacent electrodes, which short-circuiting is likely to occur due to the migration of silver). Further, when the specific Cu—Sn type alloy particles are used in the anisotropic conductive film (comprising the metal alloy particles as a conductive filler and an organic binder), the specific Cu—Sn type alloy particles exhibit high dispersibility in the organic binder, and the anisotropic conductive film can be fittedly attached to the electrodes since the film can be easily melted and distorted. Further, the anisotropic conductive film exhibits high conductivity to thereby enable high density current flowing. Therefore, even when the anisotropic conductive film is used in a fine-pitch electrode structure (in which a plurality of electrodes are disposed on both sides of the anisotropic conductive film in a fine-pitch arrangement), the anisotropic film exhibits satisfactory conductivity, so that the fine-pitch electrode structure can be advantageously used for producing a color crystal panel having a high density.

When the metal alloy particles of the present invention contain In or Sn, it is considered that an In alloy phase (composed mainly of In) and an Sn alloy phase (composed mainly of Sn) are mainly formed as the low melting point alloy phases.

With respect to a preferred method for producing the metal alloy particles of the present invention, an explanation is made below. The preferred method comprises the following four steps:

(1) providing a raw material mixture of a plurality of different materials selected from the group consisting of metals and metal alloys, the raw material mixture being capable of forming a metal alloy, (2) heat-melting the raw material mixture in an inert gas atmosphere to obtain a molten raw material mixture, (3) atomizing the molten raw material mixture, while quenching, to obtain solid metal alloy precursor particles, and (4) subjecting each solid metal alloy precursor particle to a surface treatment with at least one metal having a low melting point, wherein the surface treatment is conducted by a method selected from the group consisting of plating, sputtering, vacuum evaporation, spray coating and dipping.

It is preferred that the above-mentioned method further comprises, after step (4), the following step (5):

(5) heating the metal alloy particles obtained in step (4) in an atmosphere of inert gas containing a reducing gas in a concentration of from 0.001 to 49% by volume, based on the total volume of the inert gas and the reducing gas, the reducing gas being at least one gas selected from the group consisting of hydrogen gas, carbon monoxide gas, methane gas and hydrogen sulfide gas.

As the inert gas used in step (5), nitrogen gas is preferred. With respect to the method for heating the metal alloy particles obtained in step (4), there is no particular limitation. It is preferred that the heating is conducted at a temperature in the range of from 50 to 100° C.

In the method of the present invention, it is preferred that the raw material mixture comprises, as a first metal species, Cu and Sn; as a second metal species, at least two metals selected from the group consisting of Ag, Bi, In and Zn; and, as a third metal species, at least one metal selected from the group consisting of Sb, Al, Ga, Au, Si, Ge, Co, W, Ta, Ti, Ni, Pt, Mg, Mn, Mo, Cr and P, and wherein the metal used for the surface treatment is selected from the group consisting of Sn, In and Bi. With respect to the amounts of the metal species in the raw material mixture, it is preferred that the amounts of the metal species are such that the above-mentioned specific Cu—Sn type alloy particles can be obtained.

With respect to each of the steps of the above-mentioned method, an explanation is made below. In step (1), a raw material mixture of a plurality of different materials selected from the group consisting of metals and metal alloys, which raw material mixture is capable of forming a metal alloy, is provided (or prepared). The composition of the metal alloy particles can be controlled by appropriately selecting the types and ratios of the metals used in the raw material mixture.

In step (2), the raw material mixture is heat-melted in an inert gas atmosphere to obtain a molten raw material mixture. It is preferred that the inert gas atmosphere is a helium atmosphere. With respect to the method for heating the raw material mixture, there is no particular limitation so long as the heating is conducted at a temperature at which the raw material mixture is melted. For example, the heating can be conducted at 1,100° C. or more. As an example of the method for heating the raw material mixture, there can be mentioned a method in which the raw material mixture is placed in a graphite crucible, followed by heating using a high frequency induction heater.

In step (3), the molten raw material mixture is atomized, while quenching, to obtain solid metal alloy precursor particles (hereinafter, this method is frequently referred to as the "quench solidification method").

As a cooling medium for quenching the molten raw material mixture, an inert gas is preferred. As the inert gas, it is preferred to use an inert gas containing helium gas and having a dew point of −20° C. or less. It is considered that, by using a helium-containing inert gas having such a low dew point (i.e., having a very small water content), a plurality of alloy phases can be formed in each of the solid metal alloy precursor particles. As the inert gas, it is possible to use an inert gas containing a very small amount of a reducing gas, such as hydrogen gas, carbon monoxide gas, methane gas or hydrogen sulfide gas.

It is preferred that the quenching of the molten raw material mixture is conducted at a quenching rate of 500° C./s or more, more advantageously 1,000° C./s or more. Such a rapid quenching of the molten raw material mixture is advantageous from the viewpoint of the production cost.

The quench solidification method is advantageous in that a metastable phase can be easily formed in the solid metal alloy precursor particles. It is considered that the metal alloy particles of the present invention has a metastable phase, and the elevation of the lowest melting point of the metal alloy particles of the present invention (i.e., the elevation from the original lowest melting point (a) to the elevated lowest melting point (a')) occurs due to the presence of the metastable phase in the metal alloy particles. On the other hand, when the molten raw material mixture is subjected to gradual cooling instead of quenching, only a plurality of stable alloy phases are formed in the solid metal alloy precursor particles, so that it becomes impossible to obtain the metal alloy particles of the present invention, wherein the lowest melting point of each of the metal alloy particles is elevated by heating.

As a preferred method for conducting steps (2) and (3) in sequence, there can be mentioned a gas atomization method, which comprises melting the raw material mixture in an inert gas atmosphere to obtain a molten raw material mixture, blowing an inert gas from a nozzle to the molten mixture to cool the molten mixture, thereby obtaining solid metal alloy precursor particles.

In step (4), the solid metal alloy precursor particles obtained in step (3) are subjected to a surface treatment which is conducted by a method selected from the group consisting of plating, sputtering, vacuum evaporation, spray coating and dipping, thereby obtaining metal alloy particles.

The surface treatment of the solid metal alloy precursor particles is conducted to coat the solid metal precursor particles with a specific metal which is caused to thermally diffuse into the metal alloy particles during the heat treatment for mounting.

Examples of plating include electroless plating and electrolytic plating. Specific examples of electroless plating include displacement plating.

With respect to the plating, an explanation is made below, taking tin plating as an example.

In the case of a tin displacement plating, it is preferred that the tin displacement plating is conducted under conditions wherein the temperature of the plating solution is from 40 to 80° C., and the tin concentration of the plating solution is from 2 to 30 g/liter. It is more preferred that the tin displacement plating is conducted under conditions wherein the temperature of the plating solution is from 40 to 60° C., and the tin concentration of the plating solution is from 5 to 20 g/liter. The plating time can be appropriately selected, taking into consideration the temperature of the plating solution, the tin concentration of the plating solution, the thickness of the tin plating and the like.

In the present invention, after plating the solid metal precursor particles with a certain metal by the displacement plating, it is possible to conduct a further displacement plating for plating the solid metal precursor particles with another metal. However, in such a case, it is necessary to select the composition of the plating solution used in the further plating, taking into consideration the amount of the certain metal which is once plated on the metal precursor particles, but is displaced by another metal used in the further displacement plating.

Further, when the surface treatment is conducted by the displacement plating, a suitable displacement plating solution must be carefully chosen for the following reason. For example, when the plating solution causes a run away reaction with a component metal of the metal alloy precursor particles or when the plating solution is decomposed by a component metal of the metal alloy precursor particles, it sometimes becomes difficult to control the composition of the peripheral portion of the metal alloy particles.

When the electrolytic tin plating is employed, it is preferred that the electrolytic tin plating is conducted under conditions wherein the temperature of the plating solution is from 10 to 40° C., and the tin concentration of the plating solution is 30 g/liter or less, and it is more preferred that the electrolytic tin plating is conducted under conditions wherein the temperature of the plating solution is from 20 to 35° C., and the tin concentration of the plating solution is from 5 to 20 g/liter. In the electrolytic tin plating, an electric current flows intermittently at a cathode with a current density generally from 0.01 to 30 A/dm$^2$. An appropriate cathode current density varies depending on the composition, uniformity in composition, diameter and density of the resultant plated particles, the thickness of the plating, the production time, and the like. However, the cathode current density is preferably from 0.05 to 10 A/dm$^2$, more preferably from 0.1 to 5 A/dm$^2$. When an alloy plating solution is used, it is preferred to adjust the concentration of each metal contained in the alloy plating solution such that a metal alloy having a desired composition is plated on the solid metal precursor particles.

When the surface treatment in step (4) is conducted by sputtering, the sputtering can be conducted as follows. The metal alloy precursor particles are placed in a vacuum chamber to which discharge gas has been introduced. The positive ions of the discharge gas are accelerated in the vacuum chamber and is caused to collide with a target material which is a metal or metal alloy, to thereby expel metal or metal alloy particles from the target material. The expelled metal or metal alloy particles are accumulated on the metal alloy precursor particles to form a thin film. As the discharge gas, it is preferred to use an inert gas (such as Ar gas) which can achieve a high sputtering efficiency.

When the surface treatment in step (4) is conducted by vacuum evaporation, the vacuum evaporation can be conducted as follows. The metal alloy precursor particles and a coating metal or metal alloy are placed in a vacuum chamber. The coating metal or metal alloy is heated to vaporize the coating metal or metal alloy, thereby causing the vaporized metal or metal alloy to coat the surface of the metal alloy precursor particles. Examples of methods for heating the coating metal or metal alloy include a resistance heating method, a high frequency induction heating method and an electron beam heating method. When it is intended to coat the surface of the metal alloy precursor particles with a metal alloy, it is possible to conduct the vacuum evaporation several times in which the solid metal alloy particles are coated with a certain metal by vacuum evaporation, and the resultant coated particles are further coated with an additional metal by vacuum evaporation.

When the surface treatment in step (4) is conducted by spray coating, such as melt spray coating, the spray coating can be conducted, for example, as follows. A metal or metal alloy is heated to melt the metal or metal alloy, thereby obtaining a molten metal or metal alloy. The molten metal or metal alloy is blown from a spray nozzle to the metal alloy precursor particles to thereby form a coating on the surfaces of the metal alloy precursor particles.

When the surface treatment in step (4) is conducted by dipping, the dipping can be conducted as follows. The metal alloy precursor particles are charged into a vessel containing a molten metal or metal alloy, followed by recovery of the metal alloy particles.

If desired, prior to the above-mentioned surface treatments, the metal alloy precursor particles may be subjected to pretreatment, such as an acid treatment (reduction treatment) or a treatment for forming an anti-diffusion layer.

If desired, between step (3) and step (4), a step for classifying the metal alloy precursor particles obtained in step (3) may be conducted. It is preferred that the metal alloy precursor particles after classification have an average diameter of 10 μm or less. As a classifier, a current classifier or the like can be used.

By conducting the above-mentioned steps (1) to (4) and optionally the above-mentioned step (5), the metal alloy particles of the present invention can be obtained.

With respect to the conductive adhesive of the present invention, an explanation is made below. The conductive adhesive of the present invention comprises:

(1) the metal alloy particles of the present invention as a conductive filler, the metal alloy particles exhibiting the original lowest melting point (a), (2) an organic binder comprising a thermoplastic resin and a thermocurable resin, and (3) a curing agent for the organic binder, wherein the organic binder has a curing temperature wherein the original lowest melting point (a) of the metal alloy particles is in the range of the curing temperature of the organic binder ±50° C.

It is preferred that the original lowest melting point (a) of the metal alloy particles present in the conductive adhesive is lower than the curing temperature of the organic binder. Such a conductive adhesive can be advantageously used, for example, for mounting a semiconductor device on a substrate, wherein each of the device and substrate has disposed on a surface thereof a plurality of electrodes. The mounting is conducted by a method comprising applying the conductive adhesive on the electrodes of the substrate, disposing the semiconductor device on the substrate in a manner such that the electrodes on the device and the electrodes on the substrate face each other through the conductive adhesive, followed by heating (to melt the metal alloy particles present in the adhesive and to cure the organic binder) and subsequent cooling (to solidify the metal alloy particles). When such a mounting is conducted by using the above-mentioned conductive adhesive containing the metal alloy particles exhibiting the original lowest melting point (a) which is lower than the curing temperature of the organic binder, during the above-mentioned heating, the lowest melting point alloy phase (i) and/or the low melting point alloy phase (i'), which are/is positioned close to the surface of the metal alloy particle, are/is melted before the organic binder is cured. As a result, the mutually adjacent conductive filler particles are melt-bonded to each other, thereby forming chains of conductive filler particles. Further, at the interface between the electrode and the conductive adhesive, the molten lowest melting point alloy phase (i) and/or the molten low melting point phase (i') in the metal alloy particles as the conductive filler form(s) an intermetallic compound or intermetallic compounds with the metal of the electrode, so that the conductive adhesive is strongly bonded to the electrode. Thus, due to the melt-bonding of metals, the conductive filler particles form connections between the electrodes on the device and the electrodes on the substrate, which connections not only are mechanically very strong, but also exhibit excellent electrical properties. In the conductive adhesive of the present invention, when the original lowest melting point (a) of the metal alloy particles is relatively low, the above-mentioned mechanically strong connections having excellent electrical properties can be formed at relatively low temperatures (which, however, should be higher than the original lowest temperature (a)).

On the other hand, when the original lowest melting point (a) of the metal alloy particles is higher than the curing temperature of the organic binder, the organic binder is cured before at least a surface portion of the metal particles which exhibits the original lowest melting point (a) is melted. However, also in this case, by the cooling after the heating, the metal alloy particles exhibit the elevated lowest melting point (a'), so that the conductive adhesive is advantageous in respect of the heat resistance reliability.

In the conductive adhesive of the present invention, the average diameter of the metal alloy particles as the conductive filler is preferably in the range of from 0.1 to 20 µm, more preferably from 0.5 to 10 µm, most preferably from 1 to 8 µm.

Further, as mentioned above, the metal alloy particles are spherical or quasisherical; however, in the conductive adhesive of the present invention, even when distorted metal alloy particles are used as the conductive filler, the desired effects of the present invention can be achieved. When the metal alloy particles (conductive filler) are in a scale form, it is preferred that the average diameter of such metal alloy particles is in the range of from 1 to 15 µm (in the case of metal alloy particles having a major axis and a minor axis, the mean value of the major and minor axes is defined as the average diameter of such particles).

The oxygen content of the conductive filler (i.e., the oxygen content of the metal alloy particles) influences the connection stability at the time of use of the conductive adhesive or the dispersibility of the filler in the binder. The oxygen content is preferably 10,000 ppm or less, more preferably 8,000 ppm or less, still more preferably 6,000 ppm or less. When the oxygen content exceeds 10,000 ppm, the conductivity of the conductive adhesive tends to be unsatisfactory.

As mentioned above, the organic binder used in the present invention contains a thermocurable resin and a thermoplastic resin. The amount of the thermoplastic resin in the organic binder is preferably in the range of from 3 to 97% by weight, based on the total weight of the thermocurable resin and the thermoplastic resin. When the amount of the thermoplastic resin is smaller than 3% by weight, the below-mentioned reworkability tends to be unsatisfactory. On the other hand, when the amount of the thermoplastic resin exceeds 97% by weight, disadvantages are likely to be caused wherein the adhesive strength of the conductive adhesive becomes unsatisfactory and wherein the conductivity of the conductive adhesive cannot be stably maintained for a long time.

In the conductive adhesive of the present invention, the amount of the conductive filler (metal alloy particles) is preferably in the range of from 70 to 95% by weight, based on the total weight of the conductive filler and the organic binder. When the amount of the conductive filler is less than 70% by weight, the conductivity of the conductive adhesive tends to be unsatisfactory. On the other hand, when the amount of the conductive filler exceeds 95% by weight, disadvantages are likely to be caused wherein the workability of the conductive adhesive becomes low and wherein the conductive adhesive does not fit well with the semiconductor chip to which the adhesive is applied.

Examples of thermocurable resins include an epoxy resin, a phenolic resin, a polyimide resin, a polyurethane resin, a melamine resin and a urea resin.

Examples of epoxy resins include a bisphenol A type epoxy resin, a bisphenol F type epoxy resin, a (cresol) novolac type epoxy resin, a halogenated bisphenol type epoxy resin, a resorcin type epoxy resin, a tetrahydroxyphenolethan type epoxy resin, a polyalcohol polyglycol type epoxy resin, a glycerin triether type epoxy resin, a polyolefin type epoxy resin, an epoxidized soybean oil, cyclopenpadiene dioxide and vinylcyclohexene dioxide. Among these, preferred are a bisphenol A type epoxy resin, a bisphenol F type epoxy resin and a (cresol)novolac type epoxy resin.

Further, as the epoxy resin, it is possible to use a liquid epoxy compound having at least one glycidyl group in a molecule thereof. Examples of such compounds include phenoxymonoglycidyl ether, bisphenol A diglycidyl ether, a polypropylene glycol diglycidyl ether, hexanediol digycidyl ether, a hydrogenated bisphenol A diglycidyl ether, neopentyl glycol diglycidyl ether, glycerin diglycidyl ether, N,N-diglycidyl aniline, N,N-diglycidyl toluidine, trimethylolpropane triglycidyl ether, glycerin triglycidyl ether and a liquid polysiloxane diglycidyl ether. Among these, preferred are neopentyl glycol diglycidyl ether, glycerin diglycidyl ether and trimethylolpropane triglycidyl ether.

With respect to the thermoplastic resin, there is no particular limitation, but it is preferred to use a resin having a functional group capable of forming a hydrogen bond. The reason why the use of such a thermoplastic resin is advantageous has not been determined, but is presumed to be that the thermoplastic resin forms a hydrogen bond with a metal contained in the metal alloy particle, thereby improving the wetting of the conductive adhesive on each of the semiconductor device and the substrate.

Examples of functional groups capable of forming a hydrogen bond include hydrogen, an amide group, a urea group, an imide group, an ester group, an ether group, a thioether group, a sulfonyl group and a ketone group.

Examples of thermoplastic resins having the abovementioned functional group include a phenoxy resin, a thermoplastic polyurethane, a polyvinyl butyral, a polyamide, a thermoplastic polyimide, a polyamide-imide, a polycarbonate, a polyphenylene ether, a polyvinyl ether, a polysulfone, a polyvinyl alcohol, a polyvinyl formal, a polyvinyl acetate, a methacrylic resin and an ionomer resin.

It is preferred that the thermoplastic resin has a glass transition temperature of 300° C. or less. When the glass transition temperature of the thermoplastic resin exceeds 300° C., since the adhesive containing such a thermoplastic resin needs to be heated at a temperature exceeding 300° C. at the time of adhesion, a problem arises that a part to which the adhesive is applied deteriorates.

Preferred examples of thermoplastic resins having a glass transition temperature of 300° C. or less include a phenoxy resin, a thermoplastic polyurethane and a polyvinyl butyral. Among these, a phenoxy resin is especially preferred.

For enhancing the adhesion strength of the conductive adhesive of the present invention, it is preferred to use a combination of a thermocurable resin and a thermoplastic resin which are compatible with each other, and use such resins in respective amounts wherein the resins are compatible with each other. Examples of such combination of the resins include a combination of an epoxy resin as the thermocurable resin and a phenoxy resin as a thermoplastic resin (wherein the weight ratio of the epoxy resin to the phenoxy resin is 1:0.5 or less). In the present invention, the term "compatible" means that when both the resins are mixed with each other without using a solvent, the resultant mixture does not become opaque, or that, when a solution of a mixture of the resins in a solvent is prepared, followed by drying to remove the solvents, the resultant mixture of the resins does not become opaque.

Examples of curing agents for the organic binder include a compound capable of curing epoxy resins (hereinafter, referred to as a "epoxy-curing agent") and a resin-containing curing agent.

As the epoxy-curing agent, those which are generally employed in the art can be used. Specific examples of epoxy-curing agents include aliphatic polyamine curing agents, such as triethylenetetramine and m-xylene diamine;

aromatic amine curing agents, such as m-phenylene diamine and diaminophenylsulfone; tertiary amine curing agents, such as benzyl dimethyl amine, di-methylaminomethylphenol; acid anhydride curing agents, such as phthalic anhydride and hexahydrophthalic anhydride; and boron trifluoride-amine complex curing agents, such as $BF_3$-piperidine complex. Further, bisphenol compounds, such as bisphenol A, can also be used.

As further examples of epoxy-curing agents, there can be mentioned dicyanamide, 2-ethyl-4-methylimidazole and tris (methylamino)silane.

Examples of resin-containing curing agents include a polyamide resin produced from a linolenic dimer and ethylene diamine, a polysulfide resin having mercapto groups at both terminals thereof, and a novolac type phenolic resin.

The above-mentioned curing agents can be used individually or in combination.

The amount of the curing agent for the organic binder varies depending on the type of the curing agent. For example, in the case of an acid anhydride which stoichiometrically reacts with a glycidyl group, the most suitable amount of the curing agent can be determined from the epoxy equivalent. On the other hand, in the case of a curing agent which catalyzes a curing reaction, the curing agent is generally used in an amount of from 3 to 30% by weight, based on the weight of the organic binder.

In the case where the reactivity of the organic binder with the curing agent is high at room temperature, it is preferred that a liquid containing the curing agent is added to other components of the conductive adhesive just before the use of the adhesive, or that the curing agent is used in such a form as encapsulated in a capsule (made of gelatin or the like) having a diameter of around 100 μm.

The conductive adhesive of the present invention may further contain an additive, such as a cure accelerator, a flame retardant, a leveling agent, a thixotropy-imparting agent, an anti-settling agent, a coupling agent, a monoepoxy compound, a pigment, an anti-foaming agent and an anti-corrosion agent.

For adjusting the viscosity of the conductive adhesive of the present invention, it is possible to use a monoepoxy compound and/or at least one solvent selected from the group consisting of dimethylacetamide, N-methyl-pyrrolidone, methyl ethyl ketone, methylcellosolve, methylcarbitol, carbitol, carbitol acetate, methylcellosolve acetate and toluene. In such a case, from the viewpoint of workability, the viscosity of the obtained solution or paste is preferably in the range of from 5,000 to 400,000 mPa·s, more preferably in the range of from 20,000 to 70,000 mpas.

When the conductive adhesive containing the abovementioned specific Cu—Sn metal alloy particles as the conductive filler is used for mounting an electronic part or the like on a substrate, the conductive adhesive can provide a reworkability with respect to the electronic part and substrate ("reworkability" means the recyclability of the substrate and electronic part). In the present invention, for example, the evaluation of the reworkability of the substrate is conducted as follows. The conductive adhesive is applied onto a copper substrate to form an adhesive coating having a thickness of from 70 to 100 μm, a width of 2 mm and a length of 2 mm. Then, a copper chip (2 mm×2 mm×1 mm) is placed on the adhesive coating, followed by curing of the adhesive. The resultant copper substrate having the copper chip attached thereto is heated in an oven at 180° C. for 10 minutes. Then, the copper chip is pulled by means of a pair of tweezers to examine whether or not the copper chip is released from the copper board. When the copper chip is released from the copper board, the conductive adhesive is evaluated as being able to provide a reworkability with respect to the copper board and copper chip, whereas when the copper chip is not released from the copper board, the conductive adhesive is evaluated as being unable to provide a reworkability with respect to the copper board and copper chip.

With respect to the method for producing the conductive adhesive of the present invention, an explanation is made below. The conductive adhesive of the present invention can be produced by a method in which the above-mentioned components for the adhesive are mixed by a conventional method using a mixer, such as a ball mill, a roll mill or a planetary mixer. The mixing may be conducted, for example, for 10 to 60 minutes at room temperature.

With respect to the method for using the conductive adhesive, an explanation is made below. When the conductive adhesive is used for mounting a semiconductor device on a printed circuit board, the conductive adhesive is applied to a printed circuit board to form an adhesive coating on the board, and the device is placed on the adhesive coating, followed by heating, so as to attach the device to the printed circuit board through the conductive adhesive.

With respect to the method for application of the conductive adhesive, there is no particular limitation. Examples of methods for application include a screen printing, a dispenser application and an ink jet application.

The heating temperature should be a temperature at which the organic binder can be satisfactorily cured (generally, 100 to 230° C.). There is no particular upper limit of the heating temperature, so long as the heat deterioration of the resins contained in the organic binder would not occur.

Further, when a solid curing agent is used, for melting the solid curing agent contained in the conductive adhesive, the conductive adhesive of the present invention may be subjected to a preliminary heating at a temperature lower than the above-mentioned heating temperature used for curing the organic binder.

With respect to the anisotropic conductive film of the present invention, an explanation is made below.

The anisotropic conductive film of the present invention comprises:

(1) 1 part by weight of the metal alloy particles of the present invention as a conductive filler, the metal alloy particles exhibiting the original lowest melting point (a), and (2) 0.05 to 300 parts by weight, preferably 0.1 to 250 parts by weight, more preferably 0.5 to 200 parts by weight of an organic binder, wherein the organic binder has a curing temperature wherein the original lowest melting point (a) of the metal alloy particles is in the range of the curing temperature of the organic binder ±50° C.

In the anisotropic conductive film of the present invention, it is preferred that the original lowest temperature (a) of the metal alloy particles of the present invention is lower than the curing temperature of the organic binder. Such an anisotropic conductive film can be advantageously used for producing, for example, the below-described electronic part which comprises a substrate having disposed on a surface thereof a plurality of electrodes (A), a flexible insulating film disposed on a surface thereof a plurality of electrodes (B), and the anisotropic conductive film disposed between the electrodes (A) and the electrodes (B), wherein two opposite surfaces of the anisotropic conductive film face the electrodes (A) and the electrodes (B), respectively. Illustratively stated, when the anisotropic conductive film is attached to the electrodes (A) and the electrodes (B) by heating (to melt the metal alloy particles present in the conductive film and to cure the organic binder) and subsequent cooling (to solidify the metal alloy particles), the lowest melting point alloy phase (i) and/or the low melting point alloy phase (i'), which are/is positioned close to the surface of the metal alloy particle, are/is melted before the organic binder is cured. As a result, the mutually adjacent conductive filler particles are melt-bonded to each other, thereby forming chains of conductive filler particles. Further, at the interface between the electrode and the anisotropic conductive film, the molten lowest melting point alloy phase (i) and/or the molten low melting point phase (i') in the metal alloy particles as the conductive filler forms an intermetallic compound or intermetallic compounds with the metal of the electrode, so that the conductive film is strongly bonded to the electrode. Thus, due to the bonding of the metals, the conductive filler particles form connections between the electrodes (A) on the substrate and the electrodes (B) on the flexible insulating film, which connections not only are mechanically very strong, but also exhibit excellent electrical properties.

In the anisotropic conductive film of the present invention, when the original lowest melting point (a) of the metal alloy particles is relatively low, the abovementioned mechanically strong connections having excellent electrical properties can be formed at a relatively low temperature (which, however, should be higher than the original lowest temperature (a)).

On the other hand, when the original lowest melting point (a) of the metal alloy particles is higher than the curing temperature of the organic binder, the organic binder is cured before at least a surface portion of the metal particles which exhibits the original lowest melting point (a) is melted. However, also in this case, by the cooling after the above-mentioned heating, the metal alloy particles exhibit the elevated lowest melting point (a'), so that the anisotropic conductive film is advantageous in respect of the heat resistance reliability.

In the anisotropic conductive film of the present invention, the average diameter of the metal alloy particles as the conductive filler is preferably in the range of from 1 to 20 µm, more preferably from 1 to 10 µm, most preferably from 2 to 5 µm. When the average diameter of the metal alloy particles exceeds 20 µm, the metal alloy particles are too large. When the anisotropic film containing such large metal alloy particles is used in the above-mentioned electronic part having electrodes, there is a danger that the metal alloy particle is crushed and the crushed particle gets in contact with a neighboring electrode, thereby causing a current leakage. On the other hand, when the average particle diameter of the metal alloy particles is smaller than 1 µm, such small metal alloy particles may cause problems that the metal alloy particle which is in contact with an electrode has a diameter smaller than the thickness of the electrode, so that the contact between the metal alloy particles per se and/or the contact between the metal alloy particles and the electrodes become(s) unsatisfactory, thereby leading to a disadvantageously low conductivity of the anisotropic conductive film, and that the metal alloy particles coagulate, so that it becomes very difficult to satisfactorily disperse the metal alloy particles in the organic binder.

The oxygen content of the conductive filler (i.e., the oxygen content of the metal alloy particles) used in the anisotropic conductive film of the present invention is preferably 10,000 ppm or less, more preferably 8,000 ppm or less, still more preferably 5,000 ppm or less. When the oxygen content exceeds 10,000 ppm, the conductivity of the anisotropic conductive film tends to be unsatisfactory due to the formation of an oxide film.

When the above-mentioned specific Cu—Sn metal alloy particles are used as the conductive filler in the anisotropic conductive film of the present invention, the anisotropic conductive film exhibits not only an excellent resistance to silver migration, but also an excellent dispersiblity of the conductive filler in the organic binder, and an excellent connecting ability with the electrode since the metal alloy particles can be easily melted or distorted. Therefore, even when the electrodes are disposed on the anisotropic conductive film in a fine-pitch arrangement, it is possible to achieve a high current density and a high conductivity, so that the electronic part comprising the abovementioned anisotropic conductive film (containing the specific Cu—Sn metal alloy particles) can be advantageously used for producing a color liquid crystal panel having a high density.

Thus, the anisotropic film of the present invention has excellent properties which are needed for producing an electronic part having electrodes in high density. That is, the anisotropic film is advantageous in that the film exhibits a low electric resistance at the interface thereof with the electrode, that the film exhibits an excellent flexibility (so that, even when the film and the electrodes are pressed to combine them to each other, a satisfactory contact area between the film and the electrode can be secured without melting or distorting the conductive filler), and that the conductive filler is satisfactorily dispersed in the organic binder.

With respect to the morphology of the conductive filler used in the anisotropic film of the present invention, there is no particular limitation so long as the conductive filler is spherical or quasisherical. When the morphology of the conductive filler largely differs from a sphere (e.g., in the case where the conductive filler has an oval shape having a large long axis), a disadvantage is likely to be caused wherein some of the metal alloy particles as the conductive filler which are present between the electrodes on the substrate and the electrodes on the semiconductor device have no (direct or indirect) electrical connection to any of the electrodes.

With respect to the organic binder used in the anisotropic conductive film of the present invention, it is preferred that the organic binder contains at least one resin selected from the group consisting of a thermocurable resin, a photocurable resin, an electron radiation curable resin, a thermoplastic resin and a photothermocurable resin.

Examples of thermocurable resins include an epoxy resin, a phenolic resin, a polyamide resin, a silicone resin, a polyurethane resin, a polyimide resin and a thermocurable acrylic resin. Specific examples of epoxy resins include a bisphenol A type epoxy resin, an alicyclic epoxy resin, a linear epoxy resin, an epoxyacrylate resin, novolac type epoxy resin, a bisphenol F type epoxy resin, a brominated bisphenol A type epoxy resin, an aliphatic acid-modified epoxy resin, a polyalkylene ether type epoxy resin, a diglycidyl ester type epoxy resin and a heterocyclic epoxy resin.

If desired, the organic binder may further contain a conventional reactive diluent. Examples of conventional reactive diluents include diglycidyl ether, ethylene glycol diglycidyl ether, 1,3-butanediol diglycidyl ether, diethylene glycol diglycidyl ether.

Further, if desired, the anisotropic conductive film of the present invention may further contain a conventional curing agent as a curing agent for the organic binder. Examples of conventional curing agents include an aliphatic diamine (an addition polymerization product of an epoxy compound and an aliphatic polyamine), a polyamine or an aromatic diamine (e.g., metaphenylene diamine, diaminodiphenylmethane or diaminodiphenyl sulfone), an acid anhydride (e.g., methylmaleic anhydride, hexahydracid anhydride, pyromellitic anhydride or a Lewis acid anhydride complex), urea, phenol, melamine, a phenolic compound and a mercaptan.

Further, for promoting the curing reaction, a reaction accelerator may also be used in the anisotropic conductive film of the present invention. Examples of reaction accelerators include a tertiary amine, an amine salt, an imidazole type curing agent (e.g., 2-ethyl-4(5)-methylimidazole, 1-cyanoethyl-2-4(5)-methylimidazole, 2-heptadecylimidazole, 2-methylimidazole azine, 2-undecylimidazole or a liquid, high activity imidazole), dicyandiamide and benzoguanamine.

Examples of silicone resins include resins represented by the following formula:

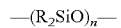

wherein R represents a methyl group or a phenyl group.

Examples of phenolic resins include a resole type phenolic resin and a novolac type phenolic resin. Specific examples of resole type phenolic resins include a phenol-formaldehyde type resole resin, an alkylphenol resole type phenolic resin, a xylene resin-modified resole type phenolic resin, and a rosin-modified phenolic resin.

Examples of polyimide resins include a condensation type polyimide resin, a bismaleimide type polyimide resin and an addition-curable polyimide.

With respect to the polyurethane resin, it is preferred to use a urethane prepolymer capable of forming a polyurethane. It is more preferred to use a urethane prepolymer obtained by using, as a raw material isocyanate compound, a blocked isocyanurate wherein active terminal isocyanate groups are blocked by an activated hydrogen compound.

Examples of thermoplastic resins include a thermoplastic acrylic resin, a butyral resin, a vinyl chloride resin, a urethane resin, a polyethylene terephthalate resin, a polyethylene resin, a polypropylene resin, a polystyrene resin, an ABS resin, a polycarbonate resin, a polyamide resin, an unsaturated polyester resin, a diallyl phthalate resin, a fluororesin, a polyphenylene sulfide resin, a polyether imide resin, a polyether ketone resin, a polyether ether ketone resin, a polyether sulfone resin, a polyarylate resin, a polybutylene terephthalate resin, a polyamide-imide resin, a modified polyphenylene oxide resin, an AAS resin, an AES resin, an ACS resin, and an AS resin.

The photocurable resin is a resin obtained by polymerizing a photopolymerizable monomer or oligomer by uisng a photoinitiator. The photocurable resin is cured using a photoinitiator.

Examples of photopolymerizable oligomers include reactive compounds (e.g., skeletons, such as a polyester, an epoxy compound, a urethane compound and the like, having addition-bonded thereto two or more functional groups selected from the group consisting of an acryloyl group and a methacryloyl group) which have a low molecular weight of from several hundreds to several thousands. Specific examples of such compounds include an epoxy acrylate, a urethane acrylate, a polyester acrylate, and a polyether acrylate.

Examples of preferred photopolymerizable monomers include a monofunctional (meth)acrylate having in a molecule thereof one acryloyl group ($CH_2$=CHCO—) or one methacryloyl group ($CH_2$=C($CH_3$)CO—), a polyfunctional (meth)acrylate having in a molecule thereof two or more groups selected from the group consisting of an acryloyl group and a methacryloyl group, and a monomer having a vinyl group ($CH_2$=CH—).

Specific examples of monofunctional acrylates include allyl acrylate, allyl methacrylate, benzyl (meth)acrylate, isobutyl acrylate, cyclohexyl (meth)acrylate, N,N-dimethylaminoethyl acrylate, glycidyl methacrylate, lauryl acrylate, a polyethylene acrylate, and a trifluoroethyl methacrylate.

Specific examples of multifunctional acrylates include 1,4-butanediol diacrylate, 1,6-hexanediol diacrylate, diethylene glycol diacrylate, neopentyl glycol acryate, a polyethylene glycol diacrylate, tripropylene glycol diacrylate, bisphenol A diethoxy diacrylate, tetraethylene glycol diacrylate, trimethylolpropane triacryate, and a pentaerythritol triacrylate.

Specific examples of reactive monomers having a vinyl group include styrene, vinyltoluene, vinyl acetate and N-vinyl pyrrolidone.

For polymerizing the above-mentioned photopolymerizable monomer or oligomer, a photoinitiator is used. As the photoinitiator, it is preferred to use a substance which is likely to release a radical upon exposure thereof to an ultraviolet ray. As the photoinitiator, it is possible to use a conventional compound, such as an acetophenone compound, a thioxanthone compound, a benzoin compound, and a peroxide. Specific examples of such conventional compounds include diethoxy acetophenone, 4-phenoxy dichloroacetophenone, benzoin, benzoin ethyl ether, benzoin isopropyl ether, benzyldimethyl ketal, benzophenone, 4-phenylbenzophenon, an acrylic benzophenone, thioxanthone and 2-ethylanthraquinone.

When the photoinitiator is used in combination with an auxiliary photoinitiator, the photopolymerization reaction can be accelerated and, hence, curing of the photocurable resin can be efficiently conducted, as compared to the case wherein no auxiliary photoinitiator is used.

Examples of auxiliary photoinitiators include conventional ones, such as an aliphatic amine and an aromatic amine. Specific examples of such amines include triethanolamine, N-methyldiethanolamine, Michler's ketone and 4,4-diethylaminophenon.

Further, if desired, the anisotropic conductive film may contain an additive, such as an antioxidant, a dispersant, a thixotropy-imparting agent. Examples of antioxidants include higher fatty acids, such as linolenic acid, palmitic acid, oleic acid, stearic acid and linoleic acid; copper salts thereof; triazole compounds, such as benzotriazole and tolyltriazole; a polymerized phosphate; and an alkanolamine. Examples of thixotropy-imparting agents include a silane coupling agent, an aluminum coupling agent, and a zirconium coupling agent.

Further, the anisotropic conductive film may contain a conventional plasticizer. From the viewpoint of the effect of the incorporation of the plasticizer in the anisotropic conductive film, the amount of the plasticizer is from 0.0001 to 15 parts by weight, relative to 100 parts by weight of the conductive filler.

The photothermocurable resin means a resin which is cured by light and heat. Examples of photothermocurable resins include a resin comprising a thermocurable resin and a photocurable resin.

The anisotropic conductive film of the present invention may be either completely dried or cured; however, it is preferred that the anisotropic conductive is semicured.

With respect to the width of the anisotropic conductive film of the present invention, there is no particular limitation. For example, when the anisotropic conductive film is used in the above-mentioned electronic part (which is explained in detail below), the width varies depending on the size, number and type of connecting electrodes used in the electronic part. The width is generally in the range of from 0.1 to 100 mm, preferably in the range of from 0.2 to 50 mm, more preferably in the range of from 0.3 to 10 mm.

With respect to the length of the anisotropic conductive film, there is no particular limitation. For example, the anisotropic conductive film may have a length of tens of meters, and the film may be cut into pieces having desired lengths which are suitable for a use as the film.

The thickness of the anisotropic conductive film is preferably in the range of from 3 to 200 μm.

The anisotropic conductive film of the present invention can be produced by a conventional method. For example, the anisotropic conductive film can be produced as follows. Given amounts of the conductive filler, the organic binder, an organic solvent and an additive are placed in a container, followed by kneading by a conventional method. The resultant mixture is applied to a base film. The resultant coating on the base film is dried to thereby volatilize the organic solvent from the coating, thereby obtaining the anisotropic conductive film of the present invention. If desired, a cover film may be attached to the surface of the anisotropic conductive film.

In the anisotropic conductive film of the present invention, it is preferred that the conductive filler is satisfactorily dispersed in the organic binder.

The anisotropic conductive film of the present invention has a unique property which is explained below, taking as an example the above-mentioned electronic part of the present invention. The electronic part comprises a substrate (connecting substrate) having disposed on a surface thereof a plurality of electrodes (substrate electrodes), a flexible insulating film having disposed on a surface thereof a plurality of electrodes (connecting electrodes), and the anisotropic conductive film disposed between the substrate electrodes and the connecting electrodes, wherein two opposite surfaces of the anisotropic conductive film face the substrate electrodes and the connecting electrodes, respectively. When a voltage is applied to the electronic part, the current flows only in one direction. More specifically, the current only flows between pairs of a substrate electrode and a connecting electrode which are arranged face-to-face through the anisotropic conductive film (hereinafter, this property is referred to as the "anisotropic conductivity").

In this connection, it should be noted that the anisotropic conductive film prior to use thereof in the production of the electronic part and the like does not need to exhibit any conductivity. Rather, it is preferred that the film prior to use exhibits an insulating property. In such case, however, it is necessary that the anisotropic conductive film exhibit the anisotropic conductivity after the production of the electronic part, which is conducted by interposing the anisotropic conductive film between the connecting electrodes on the flexible insulating film and the substrate electrodes on the substrate (connecting substrate), followed by pressing and heating. If the anisotropic conductive film prior to use exhibits conductivity, there is a danger such that a short-circuiting occurs between mutually adjacent electrodes on the flexible insulating film and on the substrate.

With respect to the electronic part of the present invention, an explanation is made below.

The electronic part of the present invention comprises:

(1) a substrate having disposed on a surface thereof a plurality of electrodes (A), (2) a flexible insulating film having disposed on a surface thereof a plurality of electrodes (B), and (3) the anisotropic conductive film of the present invention which is disposed between the electrodes (A) and the electrodes (B), wherein two opposite surfaces of the anisotropic conductive film face the electrodes (A) and the electrodes (B), respectively.

Each electrode (B) (i.e., connecting electrode) disposed on the flexible insulating film and each electrode (A) (i.e., substrate electrode) disposed on the substrate are connected through the anisotropic conductive film.

The width of the flexible insulating film varies depending on the use of the electronic part. The thickness of the flexible insulating film is preferably from 5 to 5,000 am, more preferably from 5 to 500 μm, most preferably from 5 to 200 μm.

As the flexible insulating film, any conventional flexible insulating film can be used.

Examples of flexible insulating films used in the present invention include one made of at least one material selected from the group consisting of a polyimide, a polyethylene terephthalate, a polybutylene terephthalate, a polyarylate, a polyamide-imide, a polyamide, a polyethylene, alumina, a polypropylene, polyphenylene sulfide, a polysulfone, a polyphenylene ether, a polyether ketone, a polyether ether ketone, tetrafuoroethylene, an epoxy compound and aluminum nitride.

The "connecting electrode (B)" disposed on the flexible insulating film means a conductive connector portion of a circuit (such as a conductive circuit or an IC circuit) or a portion of a part (such as an LSI chip), each of which is formed or mounted (directly or through an adhesive) on the flexible insulating film, wherein the conductive connector portion of the circuit or part conductively connects the circuit or part to another part or the above-mentioned connecting substrate of the electronic part of the present invention. If desired, a chip, such as a capacitor, a resistor, an LSI, an IC or an MCM, may be mounted on the flexible insulating film.

It is preferred that each connecting electrode (B) disposed on the flexible insulating film is independently selected from the group consisting of a Cu electrode, an Al electrode, an Au electrode, an Ag electrode, a Pt electrode, a Pd electrode, an Ag—Pd electrode, an Sn—Pb electrode, an Sn—Pb—Bi electrode, an Au—Pt electrode, an Ni electrode, an Au-plated Ni electrode, a Cu—Ag alloy electrode, an Ag—Pt electrode, an Sn/Pb solder-plated Cu electrode and an Sn/Pb solder-plated Al electrode.

The width (or diameter) of the connecting electrode (B) may vary depending on the size of the substrate electrode (A) disposed on the connecting substrate; however, the width is generally in the range of from about 6 to 5,000 μm, preferably in the range of from about 10 to 1,000 μm. There is no particular limitation with respect to the thickness of the connecting electrode (B); however, the thickness is preferably in the range of from about 0.5 to 200 μm.

With respect to the connecting substrate used in the present invention, there is no particular limitation, and conventional substrates can be used. Preferred examples of conventional substrates include a hard or flexible substrate made of a material selected from the group consisting of glass, a phenolic resin-impregnated paper, a glass epoxy resin, a polyimide resin, alumina, aluminum nitride, cordierite, mullite, amorphous silicon, monocrystalline silicon, a polycrystalline silicon, aluminum, nickel, a cadmium compound, an enamel, a polyamide resin, a polyphenylene ether resin, a polyphenylene sulfide resin, a polyether ketone resin, tetrafluoro-ethylene resin, a polyether sulfone resin, a polyarylate resin, a polyethylene terephthalate resin and a polyether ether ketone resin.

It is preferred that the connecting substrate is used as a substrate for a liquid crystal panel, a printed circuit board, or a hybrid IC board.

When the connecting substrate is used as a liquid crystal panel substrate, it is preferred that the substrate is made of glass. As the glass, any conventional glass material can be used. Preferred examples of glass materials include an alkaline zinc borosilicate, sodium borosilicate, soda lime, a low alkaline borosilicate, barium borosilicate, borosilicate, aluminoborosilicate, aluminosilicate, 96% silicate, molten quartz glass, and synthetic quartz glass.

When the connecting substrate is used as a printed circuit board, it is preferred that the substrate is made of a phenolic resin-impregnated paper, a glass epoxy resin, a polyimide resin or the like.

The thickness of the glass substrate is preferably from 0.01 to 40 mm. The glass substrate may be a multilayered substrate. As the multilayered glass, a substrate having 20 layers or less is generally used.

It is preferred that each substrate electrode (A) disposed on the connecting substrate is independently selected from the group consisting of an ITO (In—Sn—Oxide) electrode, a tin oxide electrode, an indium oxide electrode, a fluoride-doped tin oxide electrode, an Sn—plated Al electrode, an Sn/Pb solder-plated Al electrode and a Pd electrode.

It is preferred that each substrate electrode (A) for a liquid crystal panel is independently selected from the group consisting of an ITO (In—Sn—Oxide) electrode, a tin oxide electrode and an indium oxide electrode.

The substrate electrode (A) for a liquid crystal panel can be produced by conventional methods, such as spattering and vapor deposition. On the other hand, the substrate electrode (A) for a printed circuit board can be produced by conventional methods in which circuits are formed on a substrate by conducting, for example, etching of a conductive material or printing of a conductive paste.

It is preferred that each substrate electrode (A) is in the form of an oxide thin layer, or a metal or metal alloy foil.

The thickness of each substrate electrode (A) is preferably from about 0.02 to 500 μm, more preferably from 0.09 to 200 μm, most preferably from 0.1 to 100 μm. The width of each substrate electrode (A) is preferably from 6 to 1,000 μm. The distance (pitch) between mutually adjacent electrodes (A) is preferably from 6 μm or more, more preferably from 10 μm or more.

The distance between the connecting electrode (B) and the substrate electrode (A) is preferably from 0.3 to 30 μm, more preferably from 1 to 30 μm, most preferably from 1 to 25 μm.

The electronic part of the present invention can be produced by interposing the anisotropic conductive film of the present invention between the connecting electrodes (B) disposed on the flexible insulating film and the substrate electrodes (A) disposed on the connecting substrate in a manner such that the connecting electrodes (B) and the substrate electrodes (A) are conductively connected through the anisotropic conductive film. Conventional methods can be used for producing such an electronic part. One of the conventional methods is exemplified below.

First, an anisotropic conductive film is attached to the substrate electrodes (A) disposed on the connecting substrate. If desired, the anisotropic conductive film and the substrate may be pre-pressed at a low temperature of from about 50 to 120° C. under a pressure of from about 0.1 to 7 MPa.

Next, the flexible insulating film having disposed thereon the connecting electrodes (B) is placed on the anisotropic conductive film so that the anisotropic conductive film is disposed between the substrate electrodes (A) and the connecting electrodes (B) and that the connecting electrodes (B) face the substrate electrode (A), respectively, through the anisotropic conductive film. The resultant structure (comprising the substrate having disposed thereon the connecting electrodes (A), the flexible insulating film having disposed thereon the connecting electrodes (B), and the anisotropic conductive film) is subjected to a press-bonding using a heat tool at about 60 to 250° C. under a pressure of from about 0.2 to 15 MPa, thereby obtaining an electronic part. The pressure used for the press-bonding of the structure is preferably from about 0.2 to 10 MPa, more preferably from about 0.6 to 5 MPa.

When the anisotropic conductive film of the present invention is formed on the substrate electrodes (A) by coating the substrate electrodes (A) with a paste containing the components of the anisotropic conductive film, the paste is print coated on the substrate electrodes (A) (as well as the parts of the substrate around the substrate electrodes (A)) by using a screen printing technique or a dispenser technique. The thickness of the resultant coating is preferably from 5 to 50 μm. When the paste contains a solvent or volatile content, the coating is satisfactorily dried. Then, the flexible insulating film having disposed thereon the connecting electrodes (B) is placed on the anisotropic conductive film so that the anisotropic conductive film is interposed between the substrate electrodes (A) and the connecting electrodes (B) and that the connecting electrodes (B) face the substrate electrodes (A), respectively, through the anisotropic conductive film. The resultant structure (comprising the substrate having disposed thereon the connecting electrodes (A), the flexible insulating film having disposed thereon the connecting electrodes (B), and the anisotropic conductive film) is subjected to a press-bonding at about 50 to 250° C. under a pressure of from about 0.1 to 12 MPa, thereby obtaining an electronic part.

In the thus obtained electronic part, the conductive filler particles (which are contained in the anisotropic conductive film) are disposed between the substrate electrodes (A) and the connecting electrodes (B). The conductive filler particles include molten particles, each having a direct or indirect electrical connection with the connecting electrode (B) or the substrate electrode (A). When the above-mentioned press-bonding is conducted at a temperature which is lower than the temperature which is generally used for this treatment, some of the conductive filler particles (which are spherical) may be slightly distorted (crushed) during the press-bonding. By the distortion of spherical particles, the area of contact between the particles per se and the area of contact between the particles and the electrode can be increased. The degree of distortion varies depending on the distance between the connecting electrode (B) and the substrate electrode (A). However, generally, the conductive filler particles may be crushed to have a thickness of about 0.3 μm at the position where the distance between the electrode (A) and electrode (b) is the smallest. Care must be taken so that the crushed filler particles do not spread out to get in unfavorable contact with a neighboring electrode. For avoiding such unfavorable contact with a neighboring electrode, it is recommended to control the distance between mutually adjacent electrodes (or terminals).

The degree of distortion of the conductive filler is preferably from 0.1 to 30 in terms of the ratio of the distance between the connecting electrode (B) and substrate electrode (A) to the maximum length of the conductive filler particles, wherein the length of the particles is measured in a direction parallel to the flexible insulating film or the substrate.

The resistance (connection resistance) between the electrode (A) and the electrode (B) of the electronic part is generally 100 Ω or less. It is preferred that the contact resistance is as low as possible.

The electronic part of the present invention can be used for producing a liquid crystal panel, a printed circuit board, a plasma display, a thermal head or a membrane switch.

In the case of a liquid crystal panel, the driving system for the liquid crystal panel can be either a simple matrix driving system or an active matrix driving system. As examples of display systems, there can be mentioned a twist nematic system, a high inductive liquid crystal display system, an FLC or SSFLC system, a polymer dispersion liquid crystal system, a phase transition system, a dynamic scanning system, a TFT system used in combination with a TN system, and a system for improving the contrast of the display by the use of an MIM (METAL-INSULATOR-METAL) which uses a diode as a switching element in an active matrix system. Needless to say, the liquid crystal panel produced using the electronic part of the present invention can be used for a monochrome display and a color display. The electronic part of the present invention can be used for a liquid crystal panel having an electrode pitch of from about 5 to 500 μm.

In addition, the anisotropic conductive film of the present invention can be used for connecting a flexible insulating film to a printed circuit board. The flexible insulating film may have formed thereon a conductive circuit and/or have mounted thereon a chip (such as a capacitor, a resistor or an LSI). As the printed circuit board to which the flexible insulating film is connected, a conventional printed circuit board can be used. Examples of such conventional printed boards include a hybrid IC, a board having thereon an etched copper foil, a board having formed thereon a circuit formed by screen printing a conductive paste, and a multilayered resin board having, e.g., 2 to 20 layers. It is preferred that a conductor electrode on the printed circuit board is a copper foil (having a thickness of, e.g., from 5 to 50 μm) formed by etching method or additive method.

The use of the anisotropic conductive film of the present invention for connecting the flexible insulating film (e.g., flexible printed circuit board) to the electrodes on the printed circuit board ensures a satisfactory level of conductivity even when a fine printed wiring (having a width of, e.g., from 30 to 400 μm) is formed on the printed circuit board. In this case, the anisotropic conductive film fits softly with all connecting electrodes on the printed circuit board and, hence, it is unlikely that the anisotropic conductive film damages the electrodes on the circuit board. The electrodes on the printed circuit board can be connected by substantially the same method as described above in connection with the case where the electrodes (A) and (B) are used.

With respect to the soldering paste of the present invention, an explanation is made below. The soldering paste of the present invention comprises:

(1) the metal alloy particles of the present invention, as a conductive filler, the metal alloy particles exhibiting the original lowest melting point (a), and (2) a flux,
wherein the flux has a volatilizing temperature wherein the original lowest melting point (a) of the metal alloy particles is in the range of the volatilizing temperature of the flux ±50° C.

As examples of fluxes used in the present invention, there can be mentioned a resin type flux, a water-soluble flux and a non-wash type flux, but it is especially preferred to use an activated resin flux, which contains, as a main component, a rosin type natural resin or a modified resin thereof, and also contains an activator, an organic solvent, a viscosity modifier and other additives. In general, a polymerized rosin, a phenolic resin-modified rosin or the like is used as a modified rosin; an inorganic or organic flux, especially amine hydrochloride or an organic acid type flux, is used as an activator; and a carbitol type solvent or an ether type solvent is used as an organic solvent.

An inorganic type flux may be solely used depending on the type of the conductive filler.

The form of the flux may vary depending on the use of the soldering paste, and the flux may be in the form of a liquid flux, a flux paste, an aqueous flux or the like. In some cases, the flux may contain an organic solvent.

The flux in the soldering paste is used in an amount which is sufficient to enable a stable formation of a soldering paste printing or coating having a uniform composition, and sufficient to enable an integration of the conductive filler particles and an integration of the conductive filler particle with the substrate, after the soldering paste is subjected to heating and subsequent cooling in a reflow furnace. The amount of the flux is generally 5% by weight or more, preferably 7% by weight or more, more preferably from 10 to 50% by weight, based on the weight of the conductive filler.

The amount of the flux must be increased in accordance with the increase in the proportion of the conductive filler in the soldering paste, with the proviso that the increase in the amount of the flux does not impair the printing and coating properties of the soldering paste.

In the soldering paste of the present invention, it is preferred that the original lowest melting point (a) of the metal alloy particles is lower than the volatilizing temperature of the flux. Such a soldering paste can be advantageously used, for example, for mounting a semiconductor device on a substrate, wherein each of the device and substrate has disposed on a surface thereof a plurality of electrodes. The mounting is conducted by a method comprising applying the soldering paste on the electrodes of the substrate, disposing the semiconductor device on the substrate in a manner such that the electrodes on the device and the electrodes on the substrate face each other through the soldering paste, followed by heating (to melt the metal alloy particles present in the paste and to volatilize the organic solvent contained in the flux) and subsequent cooling (to solidify the metal alloy particles). When such a mounting is conducted by using the above-mentioned soldering paste containing the metal alloy particles exhibiting the original lowest melting point (a) which is lower than the volatilizing temperature of the flux, during the above-mentioned heating, the lowest melting point alloy phase (i) and/or the low melting point alloy phase (i'), which are/is positioned close to the surface of the alloy particles used as the conductive filler), are/is melted before the flux is volatilized. As a result, the mutually adjacent conductive filler particles are melt-bonded to each other, thereby forming chains of conductive filler particles. Further, at the interface between the electrode and the soldering paste, the molten lowest melting point alloy phase (i) and/or the molten low melting point phase (i') in the metal alloy particles as the conductive filler form(s) an intermetallic compound or intermetallic compounds with the metal of the electrode, so that the soldering solid (obtained by the above-mentioned heating and subsequent cooling) is strongly bonded to the electrode. Thus, due to the melt-bonding of the metals, the conductive filler particles form connections between the electrodes on the device and the electrodes on the substrate, which connections not only are mechanically very strong, but also exhibit excellent electrical properties.

When the original lowest melting point (a) of the metal alloy particles contained in the soldering paste is relatively low, the above-mentioned mechanically strong connections having excellent electrical properties can be formed at a relatively low temperature (which, however, should be higher than the original lowest temperature (a))

On the other hand, when the original lowest melting point (a) of the metal alloy particles is higher than the volatilizing temperature of the flux, the flux is volatilized before at least a surface portion of each metal alloy particle which exhibits the original lowest melting point (a) is melted. However, also in this case, by the cooling after the heating, the metal alloy particles having experienced the melting and solidification exhibits an elevated lowest melting point (a'), so that the soldering paste is advantageous in that it has an excellent reliability with respect to heat resistance.

The soldering paste of the present invention can be produced by conventional methods. For example, the soldering paste can be produced by charging a mixture of the conductive filler, the flux and other additives in predetermined amounts into a container, followed by kneading. If desired, a small amount of an organic solvent can be added to the mixture for adjusting the viscosity of the soldering paste.

With respect to the electronic part-mounted substrate (electric structure) of the present invention, an explanation is made below. The electronic part-mounted substrate is obtained by mounting an electronic part on a substrate by using the above-mentioned soldering paste. The substrate and the electronic part are conductively connected to each other through the soldering paste.

As the substrate for the electronic part-mounted substrate, conventional substrates can be used. For example, a printed circuit board can be used.

Conventional electronic parts can be used as the electronic part to be mounted on the substrate. Specific examples of electronic parts include surface-mounted electronic parts, such as a semiconductor package, a capacitor and a resistor.

The electronic part-mounted substrate of the present invention can be produced by conventional methods. An example of the method for producing the electronic part-mounted substrate is explained below.

First, a substrate, an electronic part to be mounted on the substrate, and the soldering paste are provided. Next, a predetermined pattern of the soldering paste is formed on the substrate by screen printing or dispenser coating, and the electronic part is mounted on the formed pattern. Subsequently, the soldering paste is melted and subsequently solidified in an $N_2$ reflow furnace, thereby connecting the electrodes of the electronic part to the substrate through the soldering paste. Thus, the electronic part-mounted substrate of the present invention is obtained.

Flux residues are formed during the melting and subsequent solidification of the soldering paste in the $N_2$ reflow furnace. If desired, the flux residues may be washed away using a detergent. Examples of detergents include aqueous detergents which have recently been used, and other conventional detergents, such as carbohydrate type detergents, fluoro carbon type detergents, hydrochloride type detergents and surfactant type detergents.

BEST MODE FOR CARRYING OUT THE INVENTION

Hereinbelow, the present invention will be described in more detail with reference to the following Examples and Comparative Examples, which should not be construed as limiting the scope of the present invention.

In the following Examples and Comparative Examples, various properties were measured and evaluated according to the following methods.

(1) Differential scanning calorimetry (DSC):

Particles are placed in an alumina cell and subjected to a DSC in an atmosphere of nitrogen gas (flow rate: 50 ml/min) under conditions wherein the temperature of the particles is elevated at a rate of 2° C./min to 600° C. and then maintained at 600° C. for 10 minutes. As the apparatus for the DSC, DSC-50 (manufactured and sold by Shimadzu Corporation, Japan) is used. By conducting the DSC, a DSC chart is obtained. The chart shows endothermic peaks (absorption peaks) and exothermic peaks, wherein the endothermic peaks indicate melting points. In the DSC using the above-mentioned apparatus, a peak having an amount of heat of 1 J/g or more is detected as a peak, but a peak having an amount of heat of less than 1 J/g is not detected as a peak.

The calibration of the apparatus is conducted at two temperatures of 156.6° C. (the melting point of indium) and 419° C. (the melting point of zinc).

(2) Shape of particles:

Particles are fixed onto an aluminum board by using a carbon tape. Then, the shape of particles is observed by means of a scanning electron microscope (S-2700, manufactured and sold by Hitachi Ltd., Japan).

(3) Melt-bonding of the surfaces of particles:

Whether or not the surfaces of particles are melt-bonded to each other is judged by observing the particles by means of a scanning electron microscope (S-2700, manufactured and sold by Hitachi Ltd., Japan)

(4) Average diameter of particles:

The average diameter of particles is measured using a laser diffraction instrument for a particle size distribution measurement (HELOS & RODOS, manufactured and sold by Japan Laser Corporation, Japan). The average diameter of the particles is defined as the volume average diameter of the particles. Specifically, based on the volume-based particle diameter distribution of the particles (i.e., distribution shown in a graph having an abscissa indicating the particle diameter and an ordinate indicating the volume % of the particles), a particle diameter (d) at which the total volume % of the particles having a diameter equal to or smaller than the diameter (d) becomes 50% is defined as the average diameter of the particles.

(5) Composition of particles:

The composition of particles is measured using an inductively coupled plasma atomic emission spectrometer (SPS-1700 HVR Type, manufactured and sold by Seiko Instruments Inc., Japan).

(6) Oxygen content of particles:

Using an oxygen/nitrogen analyzer (EMGA 650, Horiba Seisakusho Co., Ltd., Japan), the oxygen content of particles is measured in accordance with the inert gas impulse melting method.

(7) Shearing strength of a conductive adhesive:

A conductive adhesive is applied to a copper board to form a conductive adhesive coating having a thickness of from 70 to 100 μm, a width of 2 mm and a length of 2 mm on the copper board. Five copper chips each having a size of 2 mm×2 mm×1 mm are placed on the conductive adhesive coating so that a 2 mm×2 mm surface of the copper chip contacts the conductive adhesive coating. The conductive adhesive coating is cured at 80° C. for 30 minutes and then at 230° C. for 1 hour to thereby attach the five copper chips to the copper board through the conductive adhesive. The copper board having attached thereto five copper chips through the conductive adhesive is caused to stand vertically in a manner wherein a 2 mm×1 mm surface of the copper chip is directed upwardly. The head of a push pull gauge is thrust into the 2 mm×1 mm surface of one of the copper chips. The push pull gauge is continued to be pushed until the copper chip is released from the copper board, and the connection strength of the conductive adhesive when the copper chip is released from the copper board is measured. This procedure is conducted with respect to each of the five copper chips to thereby obtain five connection strength values. The shearing strength of the conductive adhesive is defined as the mean value of these five strength values.

(8) Reworkability:

In substantially the same manner as in item (7) above, a copper board having attached thereto a copper chip through a conductive adhesive coating is obtained.

The copper board having attached thereto the copper chip is placed in an oven and is heated at 180° C. for ten minutes. Immediately after ten minutes of heating, the copper board having attached thereto the copper chip is taken out from the oven, and the copper chip is pulled by means of a pair of tweezers to examine whether or not the copper chip is released from the copper board. When the copper chip is released from the copper board, the conductive adhesive is evaluated as being able to provide a reworkability with respect to the copper board and copper chip, whereas when the copper chip is not released from the copper board, the conductive adhesive is evaluated as being unable to provide a reworkability with respect to the copper board and copper chip.

(9) Volume resistivity of a conductive adhesive immediately after the production thereof:

Immediately after the production of a conductive adhesive, the conductive adhesive is applied to an FR-4 substrate to thereby form a conductive adhesive coating having a width of 1 cm and a length of 7 cm, wherein the thickness of the coating is in the range of from 50 to 100 μm. The conductive adhesive coating is cured at 80° C. for 30 minutes and then at 230° C. for 1 hour, thereby obtaining a conductive material. The resistance (R) of the conductive material per 1 cm is measured by means of a digital multimeter. The volume resistivity of the conductive adhesive is calculated by the following formula:

Volume resistivity (Ω·cm)=R×t×$10^{-4}$ wherein R represents the resistance of the conductive material per 1 cm, and t represents the thickness (μm) of the conductive material.

(10) Volume resistivity of a conductive adhesive after 500 hours of storing thereof:

A sample of the conductive material comprising a conductive adhesive obtained in item (9) above is introduced into a vessel in which the temperature and humidity are maintained at 85° C. and 85%, respectively. After 500 hours of storing of the sample in the vessel, the volume resistivity of the sample is measured (hereinafter, this volume resistivity is frequently referred to simply as the "volume resistivity after 500 hours").

(11) Insulation between mutually adjacent electrodes: disposed on the flexible insulating film in an electronic part:

An electronic part is introduced into a vessel in which the temperature and humidity are maintained at 85° C. and 90%, respectively. The electronic part is allowed to stand in the vessel for 1,000 hours. Then, the resistance between mutually adjacent electrodes disposed on the flexible insulating film in the electronic part is measured. Specifically, with respect to each of 100 pairs of mutually adjacent electrodes, the resistance between the mutually adjacent electrodes is measured. The insulation between mutually adjacent electrodes in the electronic part is evaluated by the following criteria:

⊚: With respect to each of 100 pairs of mutually adjacent electrodes, the resistance is $10^8$ Ω or more.

Δ: With respect to each of 50 to 99 pairs of mutually adjacent electrodes, the resistance is $10^8$ Ω or more.

×: With respect to each of 49 pairs or less of mutually adjacent electrodes, the resistance is $10^8$ Ω or more.

(12) Ratio of change in the resistance between the electrode (on the flexible insulating film) and the electrode (on the substrate) in an electronic part, which change is caused by an environmental test:

In an electronic part, the resistance between the electrode (on the flexible insulating film) and the electrode (on the substrate) is measured (hereinafter, this resistance is frequently referred to simply as the "resistance of the electronic part"). The electronic part is subjected to an environmental test comprised of 1,000 heating cycles, each comprising heating the electronic part at 85° C. for 30 minutes and then at 55° C. for 30 minutes. After the environmental test, the resistance of the electronic part is measured. The ratio of change in the resistance of the electronic part by the environmental test is evaluated by the following criteria:

⊚: The ratio of change is 20% or less.

×: The ratio of change exceeds 20%.

EXAMPLE 1

A metal particle mixture having the following composition was prepared: 6.5 kg of Cu particles (purity: 99% by weight or more), 1.5 kg of Sn particles (purity: 99% by weight or more), 1.0 kg of Ag particles (purity: 99% by weight or more), 0.5 kg of Bi particles (purity: 99% by weight or more), and 0.5 kg of In particles (purity: 99% by weight or more). The mixture was placed in a graphite crucible, and the graphite crucible was purged with helium gas (purity: 99% by volume or more). Using a high frequency induction heater (a thyristor inverter high frequency induction heater, manufactured and sold by Fuji Electronic Industrial Co., Ltd., Japan), the mixture in the graphite crucible was heated so that the temperature of the mixture became 1,400° C., thereby melting the mixture to obtain a molten mixture.

The molten mixture obtained was poured over the brim of the crucible into a spray vessel having an atmosphere of helium gas. From a gas nozzle provided around the brim of the graphite crucible, helium gas (purity: 99% by volume or more; oxygen content: 0.1% by volume; pressure: 2.5 MPa·G) was blown onto the molten mixture to atomize the molten mixture under conditions wherein the molten mixture was cooled at a rate of about 2,600° C./s, thereby obtaining solid metal alloy precursor particles. The solid metal alloy precursor particles obtained were spherical.

The solid metal alloy precursor particles were classified by using a current classifier (TC-15N, manufactured and sold by Nisshin Engineering Co., Ltd., Japan) to collect solid metal alloy precursor particles, each having a diameter of 10 µm or less. The average diameter of the solid metal alloy precursor particles after classification was 3.6 µm, and the oxygen content of the solid metal alloy precursor particles was 4,500 ppm.

The solid metal alloy precursor particles after classification were subjected to a tin displacement plating at 50° C. for 15 minutes using a tin displacement plating solution (SUBSTAR SN-5, manufactured and sold by OKUNO CHEMICAL INDUSTRIES CO., LTD., Japan) under conditions wherein the Sn concentration was 5 g/liter, thereby obtaining metal alloy particles. The metal alloy particles were washed with water to obtain a wet mass of the metal alloy particles, followed by replacement of water contained in the wet mass by ethanol. The resultant metal alloy particles were dried at 60° C. using a vacuum drier (Vacuum oven LHV-112, manufactured and sold by TABAI ESPEC Corporation, Japan) under conditions wherein the internal pressure of the vacuum drier during the drying was −70 cmHg.

The dried metal alloy particles were spherical, and had an average diameter of 3.6 µm and an oxygen content of 4,800 ppm. The metal alloy particles were subjected to analysis, and found to have a Cu content of 55.7% by weight, an Sn content of 25.2% by weight, an Ag content of 10.1% by weight, a Bi content of 5.1% by weight, and an In content of 3.9% by weight. The Pb content of the metal alloy particles was 0.001% by weight or less. With respect to the plated tin portion (i.e., the alloy phase formed by the tin displacement plating) of each metal alloy particle, the thickness thereof was calculated from the average diameter of the metal alloy particles, he found composition of the metal alloy particles and the densities of the component elements of the metal alloy particles. In determining the abovementioned thickness, the phenomena characteristic of the tin displacement plating, e.g., the change in the amounts of the component elements due to the tin displacement plating, need to be taken into consideration. Further, the calculation of the thickness was made on the supposition that, in each metal alloy particle, the plated tin portion formed the outermost layer having a uniform thickness. As a result, the thickness of the plated tin portion was found to be 0.1 µm. The volume of the plated tin portion was calculated and found to be 16% by volume, based on the volume of the metal alloy particle.

The metal alloy particles were subjected to a DSC in accordance with the above-mentioned method, the results of which are shown in FIG. 1(*a*). As is apparent from FIG. 1(*a*), the metal alloy particles exhibited endothermic peaks (melting points) at 146° C. (the original lowest melting point (a)), 438° C., 499° C. and 566° C., and exhibited exothermic peaks at 199° C. and 261° C. The alloy phase corresponding to the exothermic peak at 199° C. is presumed to be an Sn/Cu metastable phase formed by the tin displacement plating. The alloy phase corresponding to the exothermic peak at 261° C. is presumed to be a Bi/Ag metastable phase formed by the atomization of the molten mixture.

When a sample of the metal alloy particles was taken and heated at 146° C. (the original lowest melting point (a)), it was confirmed that the metal alloy particles were melt-bonded to each other at the surface portions thereof.

The metal alloy particles after the DSC had an oxygen content of 4,700 ppm, which is lower than the oxygen content (4,800 ppm) measured before the DSC.

The metal alloy particles after the DSC were placed on an alumina substrate and heated using an N$_2$ reflow machine (a mesh belt type continuous furnace, manufactured and sold by Koyo Lindberg Co., Ltd., Japan) under conditions wherein the peak temperature was 270° C., to melt the metal alloy particles, followed by solidification.

The metal alloy particles having experienced melting and subsequent solidification were subjected to a DSC again in accordance with the above-mentioned method, the results of which are shown in FIG. 1(*b*). As is apparent from FIG. 1(*b*), the metal alloy particles having experienced melting and subsequent solidification exhibited endothermic peaks (melting points) at 262° C. (the elevated lowest melting point (a')), 438° C., 499° C. and 566° C., but exhibited no exothermic peak. That is, the endothermic peak at 146° C. and the exothermic peaks at 199° C. and 261° C., each of which was observed before the melting and subsequent solidification of the metal alloy particles, had disappeared. The comparison between the melting points of the metal alloy particles before and after the melting and subsequent solidification shows that the lowest melting point of the metal alloy particles had been elevated by 116° C.

The metal alloy particles having experienced melting and subsequent solidification had an oxygen content of 4,700 ppm.

EXAMPLE 2

A metal particle mixture having the following composition was prepared: 5.0 kg of Cu particles (purity: 99% by weight or more), 2.9 kg of Sn particles (purity: 99% by weight or more), 1.0 kg of Ag particles (purity: 99% by weight or more), 0.5 kg of Bi particles (purity: 99% by weight or more), 0.5 kg of In particles (purity: 99% by weight or more), and 0.1 kg of Zn particles (purity: 99% by weight or more). The mixture was placed in a graphite crucible, and the graphite crucible was purged with helium gas (purity: 99% by volume or more). Using a high frequency induction heater (a thyristor inverter high frequency induction heater, manufactured and sold by Fuji Electronic Industrial Co., Ltd., Japan), the mixture in the graphite crucible was heated so that the temperature of the mixture became 1,400° C., thereby melting the mixture to obtain a molten mixture.

The molten mixture obtained was poured over the brim of the crucible into a spray vessel having an atmosphere of helium gas. From a gas nozzle provided around the brim of the graphite crucible, helium gas (purity: 99% by volume or more; oxygen content: 0.1% by volume; pressure: 2.5 MPa·G) was blown onto the molten mixture to atomize the molten mixture under conditions wherein the molten mixture was cooled at a rate of about 2,600° C./s, thereby obtaining solid metal alloy precursor particles. The solid metal alloy precursor particles obtained were spherical.

The solid metal alloy precursor particles were classified by using a current classifier (TC-15N, manufactured and sold by Nisshin Engineering Co., Ltd., Japan) to collect solid metal alloy precursor particles, each having a diameter of 10 µm or less. The average diameter of the solid metal alloy precursor particles after classification was 3.6 µm, and the oxygen content of the solid metal alloy precursor particles was 4,500 ppm.

The solid metal alloy precursor particles after classification were subjected to a tin displacement plating at 50° C. for 15 minutes using a tin displacement plating solution (SUBSTAR SN-5, manufactured and sold by OKUNO CHEMICAL INDUSTRIES CO., LTD., Japan) under conditions wherein the Sn concentration was 5 g/liter, thereby obtaining metal alloy particles. The metal alloy particles were washed with water to obtain a wet mass of the metal alloy particles, followed by replacement of water contained in the wet mass by ethanol. The resultant metal alloy particles were dried at 60° C. using a vacuum drier (Vacuum oven LHV-112, manufactured and sold by TABAI ESPEC Corporation, Japan) under conditions wherein the internal pressure of the vacuum drier during the drying was −70 cmHg.

The dried metal alloy particles were spherical, and had an average diameter of 3.6 μm and an oxygen content of 4,800 ppm. The metal alloy particles were subjected to analysis, and found to have a Cu content of 40.8% by weight, an Sn content of 39.2% by weight, an Ag content of 10.0% by weight, a Bi content of 5.1% by weight, an In content of 3.9% by weight, and a Zn content of 1.0% by weight. The Pb content of the metal alloy particles was 0.001% by weight or less. With respect to the plated tin portion (i.e., the alloy phase formed by the tin displacement plating) of each metal alloy particle, the thickness thereof was calculated from the average diameter of the metal alloy particles, the found composition of the metal alloy particles and the densities of the component elements of the metal alloy particles. In determining the above-mentioned thickness, the phenomena characteristic of the tin displacement plating, e.g., the change in the amounts of the component elements due to the tin displacement plating, need to be taken into consideration. Further, the calculation of the thickness was made on the supposition that, in each metal alloy particle, the plated tin portion formed the outermost layer having a uniform thickness. As a result, the thickness of the plated tin portion was found to be 0.1 μm. The volume of the plated tin portion was calculated and found to be 16% by volume, based on the volume of the metal alloy particle.

The metal alloy particles were subjected to a DSC in accordance with the above-mentioned method, the results of which are shown in FIG. 2(a). As is apparent from FIG. 2(a), the metal alloy particles exhibited endothermic peaks (melting points) at 134° C. (the original lowest melting point (a)), 195° C., 338° C. and 398° C., and exhibited an exothermic peak at 181° C. The alloy phase corresponding to the exothermic peak at 181° C. is presumed to be an Sn/Cu metastable phase formed by the tin displacement plating.

When a sample of the metal alloy particles was taken and heated at 134° C. (the original lowest melting point (a)), it was confirmed that the metal alloy particles were melt-bonded to each other at the surface portions thereof.

The metal alloy particles after the DSC had an oxygen content of 4,700 ppm, which is lower than the oxygen content (4,800 ppm) measured before the DSC.

The metal alloy particles after the DSC were placed on an alumina substrate and heated using an $N_2$ reflow machine (a mesh belt type continuous furnace, manufactured and sold by Koyo Lindberg Co., Ltd., Japan) under conditions wherein the peak temperature was 230° C., to melt the metal alloy particles, followed by solidification.

The metal alloy particles having experienced melting and subsequent solidification were subjected to a DSC again in accordance with the above-mentioned method, the results of which are shown in FIG. 2(b). As is apparent from FIG. 2(b), the metal alloy particles having experienced melting and subsequent solidification exhibited endothermic peaks (melting points) at 195° C. (the elevated lowest melting point (a')), 337° C. and 398° C., but exhibited no exothermic peak. That is, the endothermic peak at 134° C. and the exothermic peak at 181° C., each of which was observed before the melting and subsequent solidification of the metal alloy particles, had disappeared. The comparison between the melting points of the metal alloy particles before and after the melting and subsequent solidification shows that the lowest melting point of the metal alloy particles had been elevated by 61° C.

The metal alloy particles having experienced melting and subsequent solidification had an oxygen content of 4,700 ppm.

EXAMPLE 3

The solid metal alloy precursor particles obtained in Example 1 (i.e., the solid metal alloy precursor particles having an average diameter of 3.6 μm after classification) were subjected to an electrolytic tinplating by using a rotary plating device (Flow-Through Plater RP-1, manufactured and sold by C.Uyemura & Co., Ltd., Japan), thereby obtaining metal alloy particles. In the electrolytic tin-plating, as an electrolytic tin-plating solution, a solution obtained by removing Pb from a solution designed for an Sn/Pb eutectic solder plating was employed. The electrolytic tin-plating was conducted under conditions wherein the plating temperature was 25° C., the current density was 0.1 A/dm², and the plating time was 3 minutes. As the anode and cathode materials, Sn and a Ti alloy were employed, respectively. Prior to the electrolytic tin-plating, the solid metal alloy precursor particles were washed with water. The metal alloy particles obtained by the electrolytic tin-plating were washed with water to obtain a wet mass of the metal alloy particles, followed by replacement of water contained in the wet mass by ethanol. The resultant metal alloy particles were dried at 60° C. using a vacuum drier (Vacuum oven LHV-112, manufactured and sold by TABAI ESPEC Corporation, Japan) under conditions wherein the internal pressure of the vacuum drier during the drying was −70 cmHg.

The dried metal alloy particles were spherical, and had an average diameter of 3.8 μm and an oxygen content of 4,800 ppm. The metal alloy particles were subjected to analysis, and found to have a Cu content of 54.8% by weight, an Sn content of 28.5% by weight, an Ag content of 8.4% by weight, a Bi content of 4.3% by weight, and an In content of 4.0% by weight. The Pb content of the metal alloy particles was 0.001% by weight or less. With respect to the plated tin portion (i.e., the alloy phase formed by the electrolytic tin-plating) of each metal alloy particle, the thickness thereof was calculated from the average diameter of the metal alloy particles, the found composition of the metal alloy particles and the densities of the component elements of the metal alloy particles. In determining the above-mentioned thickness, the phenomena characteristic of the tin displacement plating, e.g., the change in the amounts of the component elements due to the tin displacement plating, need to be taken into consideration. Further, the calculation of the thickness was made on the supposition that, in each metal alloy particle, the plated tin portion formed the outermost layer having a uniform thickness. As a result, the thickness of the plated tin portion was found to be 0.1 μm. The volume of the plated tin portin was clacu- lated and found to be 15% by volume, based on the volume of the metal alloy particle.

The metal alloy particles were heated at a temperature in the range of from 50 to 100° C. for 15 minutes in an atmosphere of a gaseous mixture comprising 2% by volume of hydrogen gas as a reducing gas and 98% by volume of nitrogen gas. The resultant, heated metal alloy particles had an oxygen content of 4,400 ppm. This result indicates that, by heating the metal alloy particles in an inert gas atmosphere containing a very small amount of a reducing gas, the amounts of oxide layers present in the peripheral portions of the metal alloy particles were slightly reduced. The metal alloy particles after the heating had a Cu content of 54.8% by weight, an Sn content of 28.5% by weight, an Ag content of 8.4% by weight, a Bi content of 4.3% by weight, and an In content of 4.0% by weight. The Pb content of the metal alloy particles was 0.001% by weight or less.

The metal alloy particles were subjected to a DSC in accordance with the above-mentioned method, the results of which are shown in FIG. 3(a). As is apparent from FIG. 3(a), the metal alloy particles exhibited endothermic peaks (melting points) at 146° C. (the original lowest melting point (a)), 438° C., 499° C. and 566° C., and exhibited exothermic peaks at 199° C. and 261° C. The alloy phase corresponding to the exothermic peak at 199° C. is presumed to be an Sn/Cu metastable phase formed by the electrolytic tin-plating. The alloy phase corresponding to the exothermic peak at 261° C. is presumed to be a Bi/Ag metastable phase formed by the atomization of the molten mixture.

When a sample of the metal alloy particles was taken and heated at 146° C. (the original lowest melting point (a)), it was confirmed that the metal alloy particles were melt-bonded to each other at the surface portions thereof.

The metal alloy particles after the DSC had an oxygen content of 4,700 ppm, which is lower than the oxygen content (4,800 ppm) measured before the DSC.

The metal alloy particles after the DSC were placed on an alumina substrate and heated using a $N_2$ reflow machine (a mesh belt type continuous furnace, manufactured and sold by Koyo Lindberg Co., Ltd., Japan) under conditions wherein the peak temperature was 270° C., to melt the metal alloy particles, followed by solidification.

The metal alloy particles having experienced melting and subsequent solidification were subjected to a DSC again in accordance with the above-mentioned method, the results of which are shown in FIG. 3(b). As is apparent from FIG. 3(b), the metal alloy particles having experienced melting and subsequent solidification exhibited endothermic peaks (melting points) at 262° C. (the elevated lowest melting point (a')), 438° C., 499° C. and 566° C., but exhibited no exothermic peak. That is, the endothermic peak at 146° C. and the exothermic peaks at 199° C. and 261° C., each of which was observed before the melting and subsequent solidification of the metal alloy particles, had disappeared. The comparison between the melting points of the metal alloy particles before and after the melting and subsequent solidification shows that the lowest melting point of the metal alloy particles had been elevated by 116° C.

The metal alloy particles having experienced melting and subsequent solidification had an oxygen content of 4,400 ppm.

EXAMPLE 4

A mixture having the following composition was prepared: 900 parts by weight of the metal alloy particles (having an average diameter of 3.6 μm) produced in Example 1, 16.7 parts by weight of a 30% by weight solution of a phenoxy resin (PKHC, manufactured and sold by PAPHEN Co., Ltd., U.S.A.) in dimethylformamide (DMF), and 95 parts by weight of a bisphenol A type epoxy resin (AER2664, manufactured and sold by Asahi Kasei Epoxy Co., Ltd., Japan). The mixture was kneaded using a three roll mill for about an hour, thereby obtaining a paste. To the obtained paste were added 36 parts by weight of a microcapsule type epoxy resin (Novacure HX3613, manufactured and sold by Asahi Kasei Epoxy Co., Ltd., Japan), followed by kneading by means of a metal spatula for 5 minutes, thereby obtaining a conductive adhesive containing the metal alloy particles as a conductive filler.

Immediately after the production of the conductive adhesive, the conductive adhesive exhibited a shearing strength of 215 N and a volume resistivity of $2.1 \times 10^{-5}$ Ω·cm. The volume resistivity of the conductive adhesive after 500 hours was $2.2 \times 10^{-5}$ Ω·cm. Further, the conductive adhesive was able to provide good reworkability.

As apparent from the above-mentioned results, the conductive adhesive was excellent not only in conductivity and strength but also in reworkability, and was capable of stably maintaining the conductivity for a long time.

EXAMPLE 5

A mixture having the following composition was prepared: 900 parts by weight of the metal alloy particles having an average diameter of 3.6 μm produced in Example 2, 16.7 parts by weight of a 30% by weight solution of a phenoxy resin (PKHC, manufactured and sold by PAPHEN Co., Ltd., U.S.A.) in DMF, and 95 parts by weight of a bisphenol A type epoxy resin (AER2664, manufactured and sold by Asahi Kasei Epoxy Co., Ltd., Japan). The mixture was kneaded using a three roll mill for about an hour, thereby obtaining a paste. To the obtained paste were added 36 parts by weight of a microcapsule type epoxy resin (Novacure HX3613, manufactured and sold by Asahi Kasei Epoxy Co., Ltd., Japan), followed by kneading by means of a metal spatula for 5 minutes, thereby obtaining a conductive adhesive containing the metal alloy particles as a conductive filler.

Immediately after the production of the conductive adhesive, the conductive adhesive exhibited a shearing strength of 203 N and a volume resistivity of $5.2 \times 10^{-5}$ Ω·cm. The volume resistivity of the conductive adhesive after 500 hours was $5.6 \times 10^{-5}$ Ω·cm. Further, the conductive adhesive was able to provide good reworkability.

As apparent from the above-mentioned results, the conductive adhesive was excellent not only in conductivity and strength but also in reworkability, and was capable of stably maintaining the conductivity for a long time.

EXAMPLE 6

Using the metal alloy particles (having an average diameter of 3.6 μm) produced in Examples 1 and 2, seven dope solutions having compositions as shown in Table 1 were produced. Using the seven dope solutions individually, seven anisotropic conductive films (i.e., anisotropic conductive films 1 to 7) were produced. Specifically, each of the seven anisotropic conductive films was formed as follows. A white PET film having a width of 290 mm was set as a base film in a blade coater, and the dope solution was applied onto the white PET film at a rate of 0.5 m/10 sec (i.e., 3 m/min) to form an anisotropic conductive film having a width of 200 mm and a length of 500 mm on the white PET film.

Each of the formed anisotropic conductive films (i.e., anisotropic conductive films 1 to 7) was dried at 65° C. for 10 minutes using a drier (Hot drier LC-122, manufactured and sold by TABAI ESPEC Corporation, Japan). To each of the dried anisotropic conductive films was attached a transparent PET film as a transparent cover film, thereby obtaining protected anisotropic conductive films 1 to 7.

Using protected anisotropic conductive films 1 to 7 individually, seven electronic parts (i.e., electronic parts 1 to 7) were produced as follows. Each of the protected anisotropic conductive film was cut into a desired size, followed by detachment of the transparent PET film (as the cover film) from the surface of the anisotropic conductive film to expose the surface of the anisotropic conductive film. The resultant anisotropic conductive film having an exposed surface was placed on a connecting substrate having disposed thereon 100 electrodes (substrate electrodes) so that the exposed surface of the anisotropic conductive film contacted the 100 electrodes. The resultant was pressed using a contact bonding head to thereby attach the anisotropic conductive film to the connecting substrate, wherein the pressing was conducted at 80° C. under a pressure of 0.5 MPa for 3 seconds. Then, the white PET film was detached from the anisotropic conductive film to expose the surface of the anisotropic conductive film. A flexible insulating film having disposed thereon a plurality of electrodes (connecting electrodes) was placed on the exposed surface of the anisotropic conductive film so that the electrodes on the flexible insulating film were positioned opposite to the electrodes on the substrate. The resultant was pressed using a contact bonding head to thereby securely attach the flexible insulating film to the anisotropic conductive film, wherein the pressing was conducted at 200° C. under a pressure of 3 MPa for 10 seconds, thereby obtaining an electronic part. The electrode pitch (i.e., distance between mutually adjacent electrodes) was adjusted to a level in the range of from 40 to 200 Mm (see Table 2).

Thus, electronic parts 1 to 7 were obtained. With respect to each of the obtained electronic parts 1 to 7, the distance between the connecting electrodes (on the flexible insulating film) and the substrate electrodes (on the substrate), wherein the connecting electrodes and the substrate electrodes were arranged in mutually opposite relationships through the anisotropic conductive film, was in the range of from 2 to 7 μm.

With respect to electronic parts 1 to 7, the structures thereof and the material and parts used are shown in Table 2. On the other hand, Table 3 shows the resistance of the electronic part (i.e., the resistance between the connecting electrode and the substrate electrode), the insulating properties of the flexible insulating film (i.e., the resistance between mutually adjacent electrodes on the flexible insulating film), and the ratio of change in the resistance of the electronic part, which change was caused by the environmental test.

EXAMPLE 7

A mixture comprising 860 parts by weight of the metal alloy particles (having an average diameter of 3.6 μm produced in Example 1), and 14 parts by weight of a flux for soldering paste (TAS flux, manufactured and sold by SOLDER COAT Co., Ltd., Japan) was kneaded to thereby obtain a soldering paste.

An FR-4 substrate having formed thereon a pattern (for measuring the volume resistivity of the soldering paste) is prepared, and the soldering paste was coated on the pattern formed on the substrate. The resultant FR-4 substrate having formed thereon the soldering paste coating was heated using an $N_2$ reflow machine (a mesh belt type continuous furnace, manufactured and sold by Koyo Lindberg Co., Ltd., Japan) under conditions wherein the peak temperature was 230° C. (more specifically, the heating was conducted at 80° C. for 30 minutes and then at 230° C. for 1 hour, and this heating condition is described in item (9) above in connection with the measurement of the volume resistivity of conductive adhesives used in Examples 4 and 5), to thereby cure the soldering paste in the form of a coating. As a result, it was found that the volume resistivity of the soldering paste was $3 \times 10^{-5}$ Ω·cm.

The soldering paste was applied to a first copper plate having a size of 10 mm×30 mm×1 mm (thickness) to thereby form a soldering paste coating having a size of 10 mm×7 mm on the first copper plate. On the soldering paste coating formed on the first copper plate was laid a second copper plate having a size of 10 mm×30 mm×1 mm (thickness), thereby obtaining a laminate comprising the first (lower) copper plate and the second (upper) copper plate, and the soldering paste disposed between the lower and upper copper plates. The obtained laminate was heated using an $N_2$ reflow machine under conditions wherein the peak temperature was 270° C. With respect to the resultant laminate, the connection strength of the soldering paste was evaluated as follows. While pulling the lower copper plate of the laminate downward with a load of 100 g, the laminate was heated in the air under conditions wherein the temperature of the laminate was elevated at a rate of 3° C./min from 25° C. to 325° C. (that is, the elevation of the temperature was conducted over 100 minutes) and then maintained at 325° C. for 30 minutes. As a result, it was confirmed that the two copper plates were not detached from each other, which means that the conductive paste had excellent connection strength.

EXAMPLE 8

An FR-4 substrate having printed thereon electrode patterns (made from a copper foil) designed for capacitors was prepared. Using a screen printer (a high precision screen printer provided with a camera, manufactured and sold by Micro-tec Co., Ltd., Japan), the soldering paste produced in Example 7 was applied onto the electrode patterns formed on FR-4 substrate, thereby forming a coating of the soldering paste on the electrode patterns. Using a pair of tweezers, five capacitors each having a size identification No. 1608 were placed on the coating of the soldering paste on the FR-4 substrate. The resultant FR-4 substrate having five capacitors placed on the soldering paste coating thereon was heated using an $N_2$ reflow machine (a mesh belt type continuous furnace, manufactured and sold by Koyo Lindberg Co., Ltd., Japan) under conditions wherein the peak temperature was 270° C., to thereby cure the coating of the soldering paste and attach the five capacitors to the substrate through the soldering paste. Each of the cured capacitors was pulled using the tweezers in an attempt to release the cured capacitor from the FR-4 substrate, but it was impossible to release the capacitor from the FR-4 substrate.

COMPARATIVE EXAMPLE 1

A metal particle mixture having the following composition was prepared: 9.23 kg of Sn particles (purity: 99% by weight or more), 0.05 kg of Cu particles (purity: 99% by weight or more), 0.3 kg of Bi particles (purity: 99% by weight or more), 0.32 kg of Ag particles (purity: 99% by weight or more), and 0.10 kg of In particles (purity: 99% by weight or more). The mixture was placed in a graphite crucible, and the graphite crucible was purged with helium gas (purity: 99% by volume or more). Using a high frequency induction heater (a thyristor inverter high frequency induction heater, manufactured and sold by Fuji Electronic Industrial Co., Ltd., Japan), the mixture in the graphite crucible was heated so that the temperature of the mixture became 1,100° C., thereby melting the mixture to obtain a molten mixture.

The molten mixture obtained was poured over the brim of the crucible into a spray vessel having an atmosphere of helium gas. From a gas nozzle provided around the brim of the graphite crucible, helium gas (purity: 99% by volume or more; oxygen content: 0.1% by volume; pressure: 2.5 MPa·G) was blown onto the molten mixture to atomize the molten mixture under conditions wherein the molten mixture was cooled at a rate of about 2,600° C./s, thereby obtaining solid metal alloy precursor particles. The solid metal alloy precursor particles obtained were spherical.

The solid metal alloy precursor particles were classified by using a current classifier (TC-15N, manufactured and sold by Nisshin Engineering Co., Ltd., Japan) to collect solid metal alloy precursor particles, each having a diameter of 10 μm or less. The average diameter of the solid metal alloy precursor particles after classification was 3.7 μm, and the oxygen content of the solid metal alloy precursor particles was 4,500 ppm.

The metal alloy precursor particles were subjected to a DSC in accordance with the above-mentioned method. As a result, it was found that the metal alloy particles exhibited only one endothermic peak, which was observed at 208° C.

Further, the metal alloy precursor particles after the DSC were subjected to a tin displacement plating at 50° C. for 30 minutes using a tin displacement plating solution (SUBSTAR SN-5, manufactured and sold by OKUNO CHEMICAL INDUSTRIES CO., LTD., Japan), thereby obtaining metal alloy particles. The metal alloy particles were washed with water to obtain a wet mass of the metal alloy particles, followed by replacement of water contained in the wet mass by ethanol. The resultant metal alloy particles were dried at 60° C. using a vacuum drier (Vacuum oven LHV-112, manufactured and sold by TABAI ESPEC Corporation, Japan) under conditions wherein the internal pressure of the vacuum drier during the drying was −70 cmHg.

The dried metal alloy particles had an average diameter of 3.7 μm. With respect to the plated tin portion of each metal alloy particle, the thickness thereof was calculated and found to be 0.1 μm. The volume of the plated tin portion was calculated and found to be 16% by volume, based on the volume of the metal alloy particle. The dried metal alloy particles had an oxygen content of 4,800 ppm. The metal alloy particles had a Cu content of 0.01% by weight or less, an Sn content of 93.1% by weight, an Ag content of 3.2% by weight, a Bi content of 3.0% by weight, and an In content of 0.7% by weight. The Pb content of the metal alloy particles was 0.001% by weight or less.

The metal alloy particles were subjected to a DSC in accordance with the above-mentioned method. As a result, it was found that the metal alloy particles exhibited only one endothermic peak, which was observed at 208° C. In the surface portions of the metal alloy particles, no alloy phase formed by the tin displacement plating was observed.

The metal alloy particles after the DSC had an oxygen content of 4,700 ppm.

The metal alloy particles after the DSC were placed on an alumina substrate and heated using an N₂ reflow machine (a mesh belt type continuous furnace, manufactured and sold by Koyo Lindberg Co., Ltd., Japan) under conditions wherein the peak temperature was 230° C., to melt the metal alloy particles, followed by solidification.

The metal alloy particles having experienced melting and subsequent solidification were subjected to a DSC again in accordance with the above-mentioned method. As a result, it was found that the metal alloy particles exhibited only one endothermic peak, which was observed at 208° C. The comparison between the melting points (i.e., endothermic peaks) of the metal alloy particles before and after the melting and subsequent solidification shows that the melting point of the metal alloy particles remained unchanged. It was confirmed, by visual observation, that the metal alloy particles having experienced melting and subsequent solidification were bonded together and unified.

The metal alloy particles having experienced melting and subsequent solidification had an oxygen content of 4,700 ppm.

COMPARATIVE EXAMPLE 2

A metal particle mixture having the following composition was prepared: 8.9 kg of Sn particles (purity: 99% by weight or more), 0.8 kg of Zn particles (purity: 99% by weight or more), and 0.3 kg of Bi particles (purity: 99% by weight or more). The mixture was placed in a graphite crucible, and the graphite crucible was purged with helium gas (purity: 99% by volume or more). Using a high frequency induction heater (a thyristor inverter high frequency induction heater, manufactured and sold by Fuji Electronic Industrial Co., Ltd., Japan), the mixture in the graphite crucible was heated so that the temperature of the mixture became 700° C., thereby melting the mixture to obtain a molten mixture.

The molten mixture obtained was poured over the brim of the crucible into a spray vessel having an atmosphere of helium gas. From a gas nozzle provided around the brim of the graphite crucible, helium gas (purity: 99% by volume or more; oxygen content: 0.1% by volume: pressure: 2.5 MPa·G) was blown onto the molten mixture to atomize the molten mixture under conditions wherein the molten mixture was cooled at a rate of about 2,600° C./s, thereby obtaining solid metal alloy precursor particles. The solid metal alloy precursor particles obtained were spherical.

The solid metal alloy precursor particles were classified by using a current classifier (TC-15N, manufactured and sold by Nisshin Engineering Co., Ltd., Japan) to collect solid metal alloy precursor particles, each having a diameter of 10 μm or less. The average diameter of the solid metal alloy precursor particles after classification was 3.7 μm, and the oxygen content of the solid metal alloy precursor particles was 4,500 ppm.

The metal alloy precursor particles were subjected to a DSC in accordance with the above-mentioned method. As a result, it was found that the metal alloy particles exhibited only one endothermic peak, which was observed at 193° C.

Further, it was attempted to effect a tin displacement plating of the metal alloy precursor particles after the DSC at 50° C. for 15 minutes using a tin displacement plating solution (SUBSTAR SN-5, manufactured and sold by OKUNO CHEMICAL INDUSTRIES CO., LTD., Japan) under conditions wherein the Sn concentration was 5 g/liter. However, when the metal alloy precursor particles were added to the tin displacement plating solution, foaming was observed in the resultant solution, wherein the foaming is considered to be caused by decomposition of the tin displacement plating solution. Therefore, it was impossible to effect the tin displacement plating of the metal alloy precursor particles. The metal alloy precursor particles after the attempt to effect a tin displacement plating had an oxygen content of 4,800 ppm. The metal alloy precursor particles had an Sn content of 88.8% by weight, a Bi content of 3.1% by weight, and a Zn content of 8.1% by weight. The Pb content of the metal alloy precursor particles was 0.001% by weight or less.

The metal alloy precursor particles (to which the tin displacement plating had not been effected) were subjected to a DSC in accordance with the abovementioned method. As a result, it was found that the metal alloy precursor particles exhibited only one endothermic peak, which was observed at 193° C. The metal alloy precursor particles after the DSC had an oxygen content of 4,700 ppm.

The metal alloy precursor particles had almost no plated tin portion.

The metal alloy precursor particles after the DSC were placed on an alumina substrate and heated using an $N_2$ reflow machine (a mesh belt type continuous furnace, manufactured and sold by Koyo Lindberg Co., Ltd., Japan) under conditions wherein the peak temperature was 230° C., to melt the metal alloy precursor particles, followed by solidification.

The metal alloy precursor particles having experienced melting and subsequent solidification were subjected to a DSC again in accordance with the abovementioned method. As a result, it was found that the metal alloy precursor particles exhibited only one endothermic peak, which was observed at 193° C. The comparison between the melting points (i.e., endothermic peaks) of the metal alloy precursor particles before and after the melting and subsequent solidification shows that the melting point of the metal alloy precursor particles remained unchanged. It was confirmed by visual observation, that the metal alloy particles having experienced melting and subsequent solidification were bonded together and unified.

The metal alloy precursor particles having experienced melting and subsequent solidification had an oxygen content of 4,700 ppm.

COMPARATIVE EXAMPLE 3

A commercially available powder of water atomized copper (purity: 100% by weight) (SF-Cu, manufactured and sold by Nippon Atomize Metal Powders Corporation, Japan) was classified by using a current classifier to adjust the particle diameter of the copper powder. The copper powder after classification had an oxygen content of 1,800 ppm. A mixture comprising 900 parts by weight of the copper powder after classification, and 333.3 parts by weight of a 30% by weight solution of a phenoxy resin (PKHC, manufactured and sold by PAPHEN Co., Ltd., U.S.A.) in DMF was prepared. The mixture was kneaded using a three roll mill for about an hour, thereby obtaining a paste. The obtained paste was kneaded by means of a metal spatula for 5 minutes, thereby obtaining a conductive adhesive.

The obtained conductive adhesive exhibited a shearing strength of 23 N and a volume resistivity of $2.2 \times 10^{-3}$ $\Omega \cdot cm$. As is apparent from the result, the strength and conductivity of the conductive adhesive were unsatisfactory. Further, the volume resistivity of the conductive adhesive had changed by a ratio as much as 59% after 500 hours of storage.

COMPARATIVE EXAMPLE 4

A commercially available powder of water-atomized copper (purity: 100% by weight) (SF—Cu, manufactured and sold by Nippon Atomize Metal Powders Corporation, Japan) were classified by using a current classifier to adjust the particle diameter of the copper powder. The copper powder after classification had an oxygen content of 1,800 ppm.

Using the copper powder after classification, seven dope solutions having compositions as shown in Table 4 were produced. Using the seven dope solutions individually, seven anisotropic conductive films (i.e., anisotropic conductive films 8 to 14) were produced. Specifically, each of the seven anisotropic conductive films was formed as follows. A white PET film having a width of 290 mm was set as a base film in a blade coater, and the dope solution was applied onto the white PET film at a rate of 0.5 m/10 sec (i.e., 3 m/min) to form an anisotropic conductive film having a width of 200 mm and a length of 500 mm on the white PET film.

Each of the formed anisotropic conductive films (i.e., anisotropic conductive films 8 to 14) was dried at 65° C. for 10 minutes using a drier (Hot drier LC-122, manufactured and sold by TABAI ESPEC Corporation, Japan). To each of the dried anisotropic conductive films was attached a transparent PET film as a cover film, thereby obtaining protected anisotropic conductive films 8 to 14.

Using protected anisotropic conductive films 8 to 14 individually, seven electronic parts (i.e., electronic parts 8 to 14) were produced as follows. Each of the protected anisotropic conductive films was cut into a desired size, followed by detachment of the transparent PET film (as a cover film) from the anisotropic conductive film to expose a surface of the anisotropic conductive film. The resultant anisotropic conductive film having an exposed surface was placed on a connecting substrate having disposed thereon 100 electrodes (substrate electrodes) so that the exposed surface of the anisotropic conductive film contacted the 100 electrodes. The resultant was pressed using a contact bonding head to thereby attach the anisotropic conductive film to the connecting substrate, wherein the pressing was conducted at 80° C. under 0.5 MPa for 3 seconds. Then, the white PET film was detached from the anisotropic conductive film to expose the surface of the anisotropic conductive film. A flexible insulating film having disposed thereon a plurality of electrodes (connecting electrodes) was placed on the anisotropic conductive film so that the electrodes on the flexible insulating film were positioned opposite to the electrodes on the substrate. The resultant was pressed using a contact bonding head to thereby securely attach the flexible insulating film to the anisotropic conductive film, wherein the pressing was conducted at 200° C. under 3 MPa for 10 seconds. The electrode pitch (i.e., distance between two electrodes which were adjacent to each other) was adjusted to a level in the range of from 40 to 200 µm (see Table 4).

Thus, electronic parts 8 to 14 were obtained. With respect to each of the obtained electronic parts 8 to 14, the distance between the connecting electrodes (on the flexible insulating film) and the substrate electrodes (on the substrate), wherein the connecting electrodes and the substrate electrodes were arranged in mutually opposite relationships through the anisotropic conductive film, was in the range of from 2 to 7 µm.

With respect to electronic parts 8 to 14, the structure thereof and the material and parts used are shown in Table 5. On the other hand, Table 6 shows the resistance of the electronic part (i.e., the resistance between the connecting electrode and the substrate electrode), the insulating properties of the flexible insulating film (i.e., the resistances between adjacent electrodes on the flexible insulating film), and the ratio of change in the resistance of the electronic part, which change was caused by the environmental test.

COMPARATIVE EXAMPLE 5

A commercially available Sn/Pb eutectic soldering paste (a solder cream; grade: RX263-110H0(E), manufactured and sold by Nihon Handa Co., Ltd., Japan) was used to attach two copper foils to each other as explained below.

The soldering paste was applied to an FR-4 substrate having formed thereon two copper foil circuit lines for measuring the volume resistivity of the soldering paste, so as to form a coating of the soldering paste on the substrate between the two copper foil circuit lines, wherein the two copper foil circuit lines were connected to each other through the soldering paste coating. The resultant FR-4 substrate having formed thereon the coating of the soldering paste was heated using an $N_2$ reflow machine (a mesh belt type continuous furnace, manufactured and sold by Koyo Lindberg Co., Ltd., Japan) under substantially the same conditions as in Example 7 (the peak temperature was 230° C.). By the heating, the Sn/Pb particles forming the soldering paste coating were completely melted, so that the soldering paste coating which had been connecting the two copper foil circuit lines was separated into distinct two portions, which adhered to the two copper foil circuit lines, respectively. As a result, the two copper foil circuit lines (on the FR-4 substrate) having been connected to each other through the soldering paste coating became disconnected from each other. Therefore, it was impossible to evaluate the conductivity of the Sn/Pb eutectic soldering paste connecting the two copper foil circuit lines on the FR-4 substrate.

The Sn/Pb eutectic soldering paste was applied to a first copper plate having a size of 10 mm×30 mm×1 mm (thickness) to thereby form a soldering paste having a size of 10 mm×7 mm on the first copper plate. On the formed soldering plate was laid a second copper plate having the same size as the first copper plate, thereby obtaining a sandwich comprising the soldering plate and the first and second copper plates, wherein the soldering plate was sandwiched between the first and second copper plates. The obtained sandwich was heated using an $N_2$ reflow machine under conditions wherein the peak temperature was 270° C. The obtained sandwich was heated in the air under conditions wherein the temperature of the sandwich was elevated at a rate of 3° C./min from 25° C. As a result, it was confirmed that, when the temperature of the sandwich reached 189° C., the two copper plates were detached from each other and dropped.

TABLE 1

| Conductive filler | | Organic binder | | Additive | | |
|---|---|---|---|---|---|---|
| Type | Amount (part by weight) | Type | Amount (part by weight) | Type | Amount (part by weight) | Film No. |
| Conductive filler obtained in Ex. 1 | 1 | Epoxy resin (bisphenol A type)[1] | 12 | Imidazole curing agent[8] | 0.3 | 1 |
| Conductive filler obtained in Ex. 1 | 1 | Epoxy resin (bisphenol F type)[2] | 50 | Aliphatic amine curing agent[9] Silane coupling agent[10] | 0.2 0.01 | 2 |
| Conductive filler obtained in Ex. 1 | 1 | Phenol resin (resol type)[3] | 170 | Antioxidant[11] Titanium coupling agent[12] | 0.04 0.003 | 3 |
| Conductive filler obtained in Ex. 2 | 1 | Epoxy resin (epoxy acrylate)[4] | 3 | Acid anhydride[13] Aluminum coupling agent[14] | 0.05 0.03 | 4 |
| Conductive filler obtained in Ex. 2 | 1 | Polyimide resin (addition type)[5] | 1 | Silane coupling agent[10] Antioxidant Acetone[17] Hexane[18] Butyl carbitol[19] | 0.05 0.1 0.05 0.02 0.04 | 5 |
| Conductive filler obtained in Ex. 2 | 1 | Polyester resin (polyethylene terephthalate)[6] | 0.2 | Silane coupling agent[10] Plasticizer[15] Ethyl carbitol[20] | 0.0001 0.003 0.05 | 6 |
| Conductive filler obtained in Ex. 2 | 1 | Epoxy resin (fatty acid-modified)[7] | 4 | Aromatic diamine[16] Titanium coupling agent[12] | 0.003 0.05 | 7 |

Notes*:
[1] Epoxy resin (bisphenol A type): AER2600, manufactured and sold by Asahi Kasei Epoxy Co., Ltd., Japan.
[2] Epoxy resin (bisphenol F type): EP-4900, manufactured and sold by Asahi Denka Co., Ltd., Japan.
[3] Phenol resin (resol type): SUPERBECKACITE 1001, manufactured and sold by Dainippon Ink & Chemicals, Inc., Japan.
[4] Epoxy resin (epoxy acryate): CP-50, manufactured and sold by NOF Corporation, Japan.
[5] Polyimide resin (addition type): Kerimide 601, manufactured and sold by Nippon Polyimide, Co., Ltd., Japan.
[6] Polyester resin (polyethylene terephthalate): UE-3230, manufactured and sold by UNITIKA, LTD., Japan.
[7] Epoxy resin (fatty acid-modified): R-1307, manufactured and sold by ACR Co., Ltd., Japan.
[8] Imidazole curing agent: HX-3941HP, manufactured and sold by Asahi Kasei Epoxy Col, Ltd., Japan.
[9] Aliphatic amine curing agent: H-3615, manufactured and sold by ACR Co., Ltd., Japan.
[10] Silane coupling agent: KBM-403, manufactured and sold by Shin-Etsu Chemical Co., Ltd., Japan.
[11] Antioxidant: Pyrogallol, manufactured and sold by Wako Pure Chemical Industries, Ltd., Japan.
[12] Titanium coupling agent: KR-TTS, manufactured and sold by Ajinomoto Co., Ltd., Japan.
[13] Acid anhydride: H-3326, manufactured and sold by ACR Co., Ltd., Japan.
[14] Aluminum coupling agent: AL-H, manufactured and sold by Ajinomoto Co., Ltd., Japan.
[15] Plasticizer: Di-n-octylphthalate (reagent), manufactured and sold by Wako Pure Chemical Industries, Ltd., Japan.
[16] Aromatic diamine: KAYAHARD A-A, manufactured and sold by Nippon Kayaku Co., Ltd., Japan.
[17] Acetone: manufactured and sold by Wako Pure Chemical Industries, Ltd., Japan.
[18] Hexane: manufactured and sold by Wako Pure Chemical Industries, Ltd., Japan.
[19] Butyl carbitol: manufactured and sold by Wako Pure Chemical Industries, Ltd., Japan.
[20] Ethyl carbitol: manufactured and sold by Wako Pure Chemical Industries, Ltd., Japan.

TABLE 2

| Electronic part | Anisotropic conductive film No. | Flexible insulating film Material | Flexible insulating film Electrode | Substrate Material | Substrate Electrode | Electrode pitch (μm) |
|---|---|---|---|---|---|---|
| 1 | 1 | Polyimide | Cu | Glass | ITO | 200 |
| 2 | 2 | Polyimide | Al | Glass | ITO | 40 |
| 3 | 3 | Polyethylene terephthalate | Cu | Paper phenol | Cu | 200 |
| 4 | 4 | Polyphenylene sulfide | Au | Glass epoxy | Sn-plated copper | 50 |
| 5 | 5 | Polyimide | Sn-plated Cu | Polyphenylene ether | Al | 100 |
| 6 | 6 | Polyether ketone | Au-plated Ni | Polyimide | Sn/Pb-plated copper | 60 |
| 7 | 7 | Alumina | Ag-Pd | Aluminum Nitride | Ag-Pd | 120 |

TABLE 3

| Electronic part No. | Resistance (Ω) | Insulating properties | Change ratio in resistance by the environmental test (%) | Evaluation | Use |
|---|---|---|---|---|---|
| 1 | 1 | ⊚ | 2 | ⊚ | Liquid crystal panel |
| 2 | 2 | ⊚ | 1.5 | ⊚ | Liquid crystal panel |
| 3 | 0.05 | ⊚ | 1 | ⊚ | Printed circuit board |
| 4 | 0.1 | ⊚ | 3.5 | ⊚ | Printed circuit board |
| 5 | 0.02 | ⊚ | 2 | ⊚ | Flexible printed circuit board |
| 6 | 0.03 | ⊚ | 2.2 | ⊚ | Flexible printed circuit board |
| 7 | 0.08 | ⊚ | 1 | ⊚ | Hybrid IC |

TABLE 4

| Conductive filler Type | Amount (part by weight) | Organic binder Type | Amount (part by weight) | Additive Type | Amount (part by weight) | Film No. |
|---|---|---|---|---|---|---|
| Cu powder | 1 | Epoxy resin (bisphenol A type) | 12 | Imidazole curing agent | 0.3 | 8 |
| Cu powder | 1 | Epoxy resin (bisphenol F type) | 50 | Aliphatic amine curing agent<br>Silane coupling agent | 0.2<br>0.01 | 9 |
| Cu powder | 1 | Phenol resin (resol type) | 170 | Antioxidant<br>Titanium coupling agent | 0.04<br>0.003 | 10 |
| Cu powder | 1 | Epoxy resin (epoxy acrylate) | 3 | Acid anhydride<br>Aluminum coupling agent | 0.05<br>0.03 | 11 |
| Cu powder | 1 | Polyimide resin (addition type) | 1 | Silane coupling agent<br>Antioxidant<br>Acetone<br>Hexane<br>Butyl carbitol | 0.05<br>0.1<br>0.05<br>0.02<br>0.04 | 12 |
| Cu powder | 1 | Polyester resin (polyethylene terephthalate) | 0.2 | Silane coupling agent<br>Plasticizer<br>Ethyl carbitol | 0.0001<br>0.003<br>0.05 | 13 |
| Cu powder | 1 | Epoxy resin (fatty acid-modified) | 4 | Aromatic diamine<br>Titanium coupling agent | 0.003<br>0.05 | 14 |

Notes*:
With respect to the trade mark and the manufacturer of each of the organic binders and additives described in Table 4, see Table 1.

TABLE 5

| Electronic part | Anisotropic conductive film No. | Flexible insulating film | | Substrate | | Electrode pitch (μm) |
|---|---|---|---|---|---|---|
| | | Material | Electrode | Material | Electrode | |
| 8 | 8 | Polyimide | Cu | Glass | ITO | 200 |
| 9 | 9 | Polyimide | Al | Glass | ITO | 40 |
| 10 | 10 | Polyethylene terephthalate | Cu | Paper phenol | Cu | 200 |
| 11 | 11 | Polyphenylene sulfide | Au | Glass epoxy | Sn-plated copper | 50 |
| 12 | 12 | Polyimide | Sn-plated Cu | Polyphenylene ether | Al | 100 |
| 13 | 13 | Polyether ketone | Au-plated Ni | Polyimide | Sn/Pb-plated copper | 60 |
| 14 | 14 | Alumina | Ag-Pd | Aluminum nitride | Ag-Pd | 120 |

TABLE 6

| Electronic part No. | Resistance (Ω) | Insulating properties | Change ratio in resistance by the environmental test (%) | Evaluation | Use |
|---|---|---|---|---|---|
| 8 | 80 | ◉ | 400 | X | Liquid crystal panel |
| 9 | 2 | X | 10 | ◉ | Liquid crystal panel |
| 10 | 0.05 | Δ | 55 | X | Printed circuit board |
| 11 | 0.5 | Δ | 70 | X | Printed circuit board |
| 12 | 0.3 | ◉ | 200 | X | Flexible printed circuit board |
| 13 | 0.5 | ◉ | 150 | X | Flexible printed circuit board |
| 14 | 0.4 | Δ | 90 | X | Hybrid IC |

INDUSTRIAL APPLICABILITY

In the production of a conductive adhesive, an anisotropic conductive film, a soldering paste and the like, the metal alloy particles of the present invention can be advantageously used as a conductive filler which does not contain very poisonous lead used in conventional conductive fillers and, hence, exhibits high safety. Further, the metal alloy particles of the present invention have the following advantages. For example, when the conductive adhesive or soldering paste, each of which contains the metal alloy particles of the present invention as a conductive filler, is used for conductively connecting a semiconductor device or an electronic part to a substrate for an electronic circuit, such as a printed circuit board (i.e., when the conductive adhesive or soldering paste is used for mounting the device or part on the substrate), the mounting is conducted by heat treatment to melt the conductive adhesive or soldering paste, which is deposited between the device or part and the substrate, followed by cooling to solidify the melted adhesive or paste. In such a case, by the use of the metal alloy particles of the present invention in the conductive adhesive or soldering paste, even when the above-mentioned heat treatment (hereinafter, referred to as the "initial heat treatment") for mounting is conducted at a temperature conventionally which is lower than a heating temperature conventionally employed for the mounting, the device or part can be securely mounted on the substrate. In addition, after the initial heat treatment for mounting, the metal alloy particles contained in the conductive adhesive or soldering paste exhibit an elevated lowest melting point higher than its original lowest melting point, so that, even when the substrate having mounted thereon the device or part is subjected to further heat treatment (conducted for mounting another device or part on the substrate) at the same temperature as employed for the initial heat treatment, the metal alloy particles contained in the conductive adhesive or soldering paste are not melted and, hence, it is possible to prevent displacement of the semiconductor device or electronic part (that is, the conductive adhesive or soldering paste has excellent reliability with respect to heat resistance). Further, the conductive adhesive or soldering paste is advantageous in that, even when the conductive adhesive or soldering paste is exposed to high temperature conditions, the conductive adhesive or soldering paste can maintain the stand-off between the semiconductor device or electronic part and the substrate. In the case of the anisotropic conductive film comprising the metal alloy particles of the present invention, the anisotropic conductive film has the following advantages. When the anisotropic conductive film is used for production of an electronic part comprising an anisotropic conductive film having disposed on each surface thereof a plurality of electrodes, wherein the electrodes are attached to the anisotropic conductive film by heat treatment, the anisotropic conductive film can be securely attached to the electrodes at heating temperatures which are lower than a conventionally employed temperature. In addition, even when the electrodes are disposed on the anisotropic conductive film in a fine-pitch arrangement, a high current density and a high conductivity can be achieved. Therefore, the electronic part obtained can be advantageously used, for example, for producing a color liquid crystal panel having a high density.

The invention claimed is:

1. Metal alloy particles containing substantially no lead, each exhibiting a plurality of different melting points, as measured by differential scanning calorimetry (DSC) and identified as temperatures at which endothermic peaks are observed in the DSC, said plurality of different melting points including an original lowest melting point (a) and a highest melting point, wherein, when the metal alloy particles are subjected to DSC, at least one exothermic peak is observed in the DSC, wherein each of said metal alloy particles exhibits said original lowest melting point (a) at least at a surface portion thereof, wherein, when each metal alloy particle is heated at a temperature equal to or higher than said original lowest melting point (a) to melt at least a surface portion of each metal alloy particle which exhibits said original lowest melting point (a), followed by cooling to room temperature to thereby solidify the melted portion of each metal alloy particle, the resultant solid metal alloy particle having experienced the melting and solidification exhibits an elevated lowest melting point (a') higher than said original lowest melting point (a), and wherein each metal alloy particle comprises (i) a lowest melting point alloy phase exhibiting said original lowest melting point (a) within the range of from 40 to 250° C., and (ii) a high melting point alloy phase exhibiting a melting point higher than 250° C., said lowest melting point alloy phase (i) being positioned within a distance of 0.2 r from the surface of said particle, wherein r represents the radius of said metal alloy particle.

2. The metal alloy particles according to claim 1, wherein said elevated lowest melting point (a') is at least 2° C. higher than said original lowest melting point (a).

3. The metal alloy particles according to claim 1, wherein each metal alloy particle further comprises (i') a low melting point alloy phase exhibiting an original melting point (b), as measured before the heating, which is within the range of from 40 to 250° C., with the proviso that said original melting point (b) is higher than said original lowest melting point (a), said low melting point alloy phase (i') being positioned within a distance of 0.2 r from the surface of said particle, wherein r represents the radius of said metal alloy particle.

4. The metal alloy particles according to claim 1 or 2, wherein each metal alloy particle comprises, as a first metal species, Cu and Sn; as a second metal species, at least two metals selected from the group consisting of Ag, Bi, In and Zn; and, optionally, as a third metal species, at least one metal selected from the group consisting of Sb, Al, Ga, Au, Si, Ge, Co, W, Ta, Ti, Ni, Pt, Mg, Mn, Mo, Cr and P.

5. The metal alloy particles according to claim 4, wherein:
the content of Cu as said first metal species in each metal alloy particle is in the range of from 10 to 90% by weight,
the content of Sn as said first metal species in each metal alloy particle is in the range of from 5 to 80% by weight,
when each metal alloy particle comprises Ag as said second metal species, the content of Ag in each metal alloy particle is in the range of from 0.5 to 20% by weight,
when each metal alloy particle comprises Bi as said second metal species, the content of Bi in each metal alloy particle is in the range of from 0.5 to 15% by weight,
when each metal alloy particle comprises In as said second metal species, the content of In in each metal alloy particle is in the range of from 0.5 to 15% by weight,
when each metal alloy particle comprises Zn as said second metal species, the content of Zn in each metal alloy particle is in the range of from 1 to 5% by weight, and
when each metal alloy particle comprises said at least one third metal species, the total content of said third metal species in each metal alloy particle is in the range of from 0.01 to 3% by weight.

6. A method for producing the metal alloy particles of claim 1 or 2, which comprises:

(1) providing a raw material mixture which comprises, as a first metal species, Cu and Sn; as a second metal species, at least two metals selected from the group consisting of Ag, Bi, In and Zn; and, optionally, as a third metal species, at least one metal selected from the group consisting of Sb, Al, Ga, Au, Si, Ge, Co, W, Ta, Ti, Ni, Pt, Mg, Mn, Mo, Cr and P, (2) heat-melting said raw material mixture in an inert gas atmosphere to obtain a molten raw material mixture, (3) atomizing said molten raw material mixture, while quenching, to obtain solid metal alloy precursor particles, wherein, the solid metal alloy precursor particles exhibit at least one exothermic peak when metal alloy particles obtained in the subsequent step (4) are subjected to differential scanning calorimetry (DSC), and (4) subjecting each solid metal alloy precursor particle to a surface treatment with at least one metal selected from the group consisting of Sn, In and Bi, wherein said surface treatment is conducted by a method selected from the group consisting of plating, sputtering, vacuum evaporation, spray coating and dipping, thereby obtaining metal alloy particles.

7. The method according to claim 6, which further comprises heating said metal alloy particles obtained in step (4) in an atmosphere of inert gas containing a reducing gas in a concentration of from 0.001 to 49% by volume, based on the total volume of the inert gas and the reducing gas, the reducing gas being at least one gas selected from the group consisting of hydrogen gas, carbon monoxide gas, methane gas and hydrogen sulfide gas.

8. A conductive adhesive comprising:

(1) the metal alloy particles of claim 1 or 2 as a conductive filler, said metal alloy particles exhibiting said original lowest melting point (a), (2) an organic binder comprising a thermoplastic resin and a thermocurable resin, and (3) a curing agent for said organic binder, wherein said organic binder has a curing temperature wherein the original lowest melting point (a) of said metal alloy particles is in the range of the curing temperature of said organic binder ±50° C.

9. The conductive adhesive according to claim 8, wherein the amount of said metal alloy particles as a conductive filler is 70 to 95% by weight, based on the total weight of said metal alloy particles and said organic binder, and the amount of said thermoplastic resin contained in said organic binder is 3 to 97% by weight, based on the total weight of said thermoplastic resin and said thermocurable resin, and wherein said metal alloy particles as a conductive filler have an average particle diameter of from 0.1 to 20 µm, and each of said metal alloy particles has an oxygen content of 10,000 ppm or less.

10. The conductive adhesive according to claim 8, wherein said thermoplastic resin is a resin having a group capable of forming a hydrogen bond and said thermocurable resin is at least one resin selected from the group consisting of an epoxy resin, a phenolic resin, a polyimide resin, a polyurethane resin, a melamine resin and a urea resin.

11. The conductive adhesive according to claim 8, wherein said thermocurable resin is compatible with said thermoplastic resin.

12. The conductive adhesive according to claim 11, wherein said thermoplastic resin is a phenoxy resin and said thermocurable resin is an epoxy resin.

13. An anisotropic conductive film comprising:
(1) 1 part by weight of the metal alloy particles of claim 1 or 2 as a conductive filler, said metal alloy particles exhibiting said original lowest melting point (a), and
(2) 0.05 to 300 parts by weight of an organic binder,
wherein said organic binder has a curing temperature wherein the original lowest melting point (a) of said metal alloy particles is in the range of the curing temperature of said organic binder ±50° C.

14. The anisotropic conductive film according to claim 13, wherein said metal alloy particles as a conductive filler have an average particle diameter of from 0.1 to 20 μm, and each of said metal alloy particles has an oxygen content of 10,000 ppm or less.

15. The anisotropic conductive film according to claim 13, wherein said organic binder comprises at least one resin selected from the group consisting of a thermocurable resin, a thermoplastic resin, a photocurable resin, an electron radiation curable resin and a photothermocurable resin.

16. An electronic part comprising:
(1) a substrate having disposed on a surface thereof a plurality of electrodes (A),
(2) a flexible insulating film having disposed on a surface thereof a plurality of electrodes (B), and
(3) the anisotropic conductive film of claim 13 disposed between said electrodes (A) and said electrodes (B), wherein two opposite surfaces of said anisotropic conductive film face said electrodes (A) and said electrodes (B), respectively,
wherein each electrode (A) and each electrode (B) are, respectively, an anode and a cathode, or a cathode and an anode, and
wherein said anisotropic conductive film disposed between said electrodes (A) and said electrodes (B) exhibits an anisotropic electrical conductivity.

17. The electronic part according to claim 16, wherein each electrode (B) disposed on said flexible insulating film is independently selected from the group consisting of a Cu electrode, an Al electrode, an Au electrode, an Ag electrode, a Pt electrode, a Pd electrode, an Ag—Pd electrode, an Sn—Pb electrode, an Sn—Pb—Bi electrode, an Au—Pt electrode, an Ni electrode, an Au-plated Ni electrode, a Cu—Ag alloy electrode, an Ag—Pt electrode, an Sn/Pb solder-plated Cu electrode, and an Sn/Pb solder-plated Al electrode.

18. The electronic part according to claim 16, wherein said substrate is selected from the group consisting of a printed circuit board, a hybrid IC board and a substrate for a liquid crystal panel.

19. A soldering paste comprising:
(1) the metal alloy particles of claim 1 or 2, as a conductive filler, said metal alloy particles exhibiting said original lowest melting point (a), and
(2) a flux,
wherein said flux has a volatilizing temperature wherein the original lowest melting point (a) of said metal alloy particles is in the range of the volatilizing temperature of said flux ±50° C.

20. An electronic part-mounted substrate obtained by mounting an electronic part on a substrate using the soldering paste of claim 19.

* * * * *

UNITED STATES PATENT AND TRADEMARK OFFICE
CERTIFICATE OF CORRECTION

| | | |
|---|---|---|
| PATENT NO. | : 7,169,209 B2 | Page 1 of 1 |
| APPLICATION NO. | : 10/398114 | |
| DATED | : January 30, 2007 | |
| INVENTOR(S) | : Shuichi Nakata et al. | |

It is certified that error appears in the above-identified patent and that said Letters Patent is hereby corrected as shown below:

On the Title Page, should read, Item (73) Assignee:  Asahi Kasei EMD Corporation, Tokyo (JP)

Signed and Sealed this

Twenty-second Day of May, 2007

JON W. DUDAS
*Director of the United States Patent and Trademark Office*